United States Patent
Yamamoto et al.

(10) Patent No.: US 9,966,040 B2
(45) Date of Patent: May 8, 2018

(54) DISPLAY DEVICE AND DRIVING METHOD THEREOF

(71) Applicant: Sharp Kabushiki Kaisha, Osaka-shi, Osaka (JP)

(72) Inventors: Kaoru Yamamoto, Osaka (JP); Yasuyuki Ogawa, Osaka (JP); Akihiro Oda, Osaka (JP); Masahiro Tomida, Osaka (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 124 days.

(21) Appl. No.: 14/783,548

(22) PCT Filed: Feb. 25, 2014

(86) PCT No.: PCT/JP2014/054555
§ 371 (c)(1),
(2) Date: Oct. 9, 2015

(87) PCT Pub. No.: WO2014/174889
PCT Pub. Date: Oct. 30, 2014

(65) Prior Publication Data
US 2016/0063955 A1    Mar. 3, 2016

(30) Foreign Application Priority Data

Apr. 25, 2013    (JP) ................. 2013-092425

(51) Int. Cl.
*G09G 5/10* (2006.01)
*H03K 3/356* (2006.01)
*G09G 3/36* (2006.01)

(52) U.S. Cl.
CPC ............. *G09G 5/10* (2013.01); *G09G 3/3677* (2013.01); *H03K 3/356026* (2013.01);
(Continued)

(58) Field of Classification Search
CPC .... G09G 5/10; G09G 3/3677; G09G 2310/08; G09G 2300/0426; G09G 2310/0286; H03K 3/356026
See application file for complete search history.

(56) References Cited

U.S. PATENT DOCUMENTS 4,049,980 A * 9/1977 Maitland ................. G05F 3/205
327/541
5,103,277 A * 4/1992 Caviglia ............. H01L 27/1203
257/348
(Continued)

FOREIGN PATENT DOCUMENTS

JP    2003-273228 A    9/2003
JP    2006-174294 A    6/2006
(Continued)

OTHER PUBLICATIONS

Official Communication issued in International Patent Application No. PCT/JP2014/054555, dated May 20, 2014.

*Primary Examiner* — Benyam Ketema
(74) *Attorney, Agent, or Firm* — ScienBiziP, P.C.

(57) ABSTRACT

A display device includes: a display unit, a driver unit, and a control unit. The display unit includes a plurality of pixel units arranged in a matrix. The driver unit includes an output transistor configured to drive a plurality of scanning lines connected to the plurality of pixel units. The control unit is configured to supply to the driver unit in a display period, a signal for displaying an image on the display unit, and control a bias state of the output transistor in a display suspension period, so that an absolute value of a threshold voltage of the output transistor which is increased in the display period decreases.

20 Claims, 22 Drawing Sheets

(52) U.S. Cl.
CPC ............... *G09G 2300/0426* (2013.01); *G09G 2310/0286* (2013.01); *G09G 2310/08* (2013.01)

(56) References Cited

U.S. PATENT DOCUMENTS

| | | | | |
|---|---|---|---|---|
| 6,097,113 | A * | 8/2000 | Teraoka | H01L 27/092 |
| | | | | 257/E27.062 |
| 6,097,257 | A * | 8/2000 | Kadowaki | G04F 5/06 |
| | | | | 331/116 FE |
| 6,410,899 | B1 * | 6/2002 | Merrill | H04N 3/155 |
| | | | | 250/208.1 |
| 8,803,785 | B2 * | 8/2014 | Takahashi | G11C 19/184 |
| | | | | 345/100 |
| 8,817,501 | B1 * | 8/2014 | Low | H02M 3/07 |
| | | | | 363/59 |
| 2001/0035849 | A1 * | 11/2001 | Kimura | G09G 3/3258 |
| | | | | 345/76 |
| 2002/0003964 | A1 * | 1/2002 | Kanbara | G09G 3/3677 |
| | | | | 396/661 |
| 2003/0002615 | A1 * | 1/2003 | Morosawa | G11C 8/04 |
| | | | | 377/64 |
| 2003/0102568 | A1 * | 6/2003 | Tomishima | G01R 31/31723 |
| | | | | 257/777 |
| 2005/0199879 | A1 * | 9/2005 | Hoffman | H01L 29/7869 |
| | | | | 257/72 |
| 2011/0102409 | A1 * | 5/2011 | Hayakawa | H01L 27/1225 |
| | | | | 345/212 |
| 2012/0138922 | A1 | 6/2012 | Yamazaki et al. | |
| 2012/0176357 | A1 * | 7/2012 | Katoh | G06F 3/0412 |
| | | | | 345/207 |
| 2016/0042806 | A1 * | 2/2016 | Ogawa | G11C 19/28 |
| | | | | 345/205 |

FOREIGN PATENT DOCUMENTS

| | | | |
|---|---|---|---|
| JP | 2012-134475 A | 7/2012 | |
| WO | 2013/018598 A1 | 2/2013 | |
| WO | WO2013018598 * | 2/2013 | ............... G09G 3/36 |

* cited by examiner

DISPLAY DEVICE AND DRIVING METHOD THEREOF

TECHNICAL FIELD

The present invention relates to a display device and a driving method thereof. More particularly, the present invention relates to a technique for suppressing the shift of threshold voltages of transistors constituting a peripheral circuit.

Priority is claimed on Japanese Patent Application No. 2013-092425, filed Apr. 25, 2013, the content of which is incorporated herein by reference.

BACKGROUND ART

In recent years, a so-called monolithic circuit technology is becoming widespread in display devices of the active matrix type. The monolithic circuit technology is a technology in which pixel TFTs (Thin Film Transistors) for injecting charges to pixels and peripheral circuit TFTs constituting a peripheral circuit such as a driver circuit for driving scanning lines or signal lines connected to the pixel TFTs, are formed on the same glass substrate.

Relatively high voltage stress is applied to a gate electrode of a TFT used as an output transistor of a driver circuit included in this type of a display device. Due to the voltage stress, a gate threshold voltage (hereinafter referred to as a "threshold voltage"), which is one of electric characteristics of the TFT, shifts. The shift in threshold voltage of the TFT due to the voltage stress is caused by electrons being trapped in a gate insulating film of the TFT. When the threshold voltage of the TFT constituting the driver circuit remarkably shifts, it becomes impossible to sufficiently inject charge into pixels, thereby making it likely to deteriorate the display performance of the display device.

As a prior art directed to addressing this problem, Japanese Patent Application Laid-Open Publication No. 2006-174294 (Patent Document 1) describes a TFT having a double gate structure provided with a back gate to adjust a shift (fluctuation, variation) in threshold voltage of the TFT. According to this prior art, based on a relationship between a control voltage and a threshold voltage, which is previously obtained by experiments, a control voltage with the same polarity as that of a variation in threshold voltage is applied to the back gate, thereby adjusting the variation in threshold voltage of the TFT.

CITATION LIST

Patent Document

[Patent Document 1] Japanese Patent Application Laid-Open Publication No. 2006-174294

DISCLOSURE OF THE INVENTION

Problems to be Solved by the Invention

According to the technique described in Patent Document 1, it is possible to adjust and compensate the shift in threshold voltage of the TFT based on the relationship between the control voltage and the threshold voltage, which is previously obtained by experiments. However, for example, in a case where the shift amount of the threshold voltage is large, it is necessary to apply to the back gate, a high voltage such as several ten V (volts). Further, it is necessary to adjust the voltage to be applied to the back gate in accordance with a degree of the shift in threshold voltage of the TFT.

The present invention has been made in view of the above problems, and an object thereof is to provide a display device and a driving method thereof capable of reducing the shift in threshold voltages of transistors constituting a driver circuit, thereby suppressing deterioration of display performance.

Means for Solving the Problems

To solve the above problems, a display device according to one aspect of the present invention includes: a display unit including a plurality of pixel units arranged in a matrix; a driver unit including an output transistor configured to drive a plurality of scanning lines connected to the plurality of pixel units constituting the display unit; and a control unit configured to supply to the driver unit in a display period, a signal for displaying an image on the display unit, and control a bias state of the output transistor in a display suspension period, so that an absolute value of a threshold voltage of the output transistor which is increased in the display period decreases.

To solve the above problems, a method of driving a display device according to one aspect of the present invention is a method of driving a display device including: a display unit including a plurality of pixel units arranged in a matrix; a driver unit including an output transistor configured to drive a plurality of scanning lines connected to the plurality of pixel units constituting the display unit; and a control unit configured to supply to the driver unit in a display period, a signal for displaying an image on the display unit. The method includes a step for the control unit to control a bias state of the output transistor in a display suspension period, so that an absolute value of a threshold voltage of the output transistor which is increased in the display period decreases.

Effects of the Invention

According to one aspect of the present invention, it is possible to suppress the shift in threshold voltages of the transistors constituting the driver circuit.

MODE FOR CARRYING OUT THE INVENTION

[First Embodiment]
(Description of Configuration)

A configuration of a display device 100 according to a first embodiment of the present invention will be described.

Figure 1:
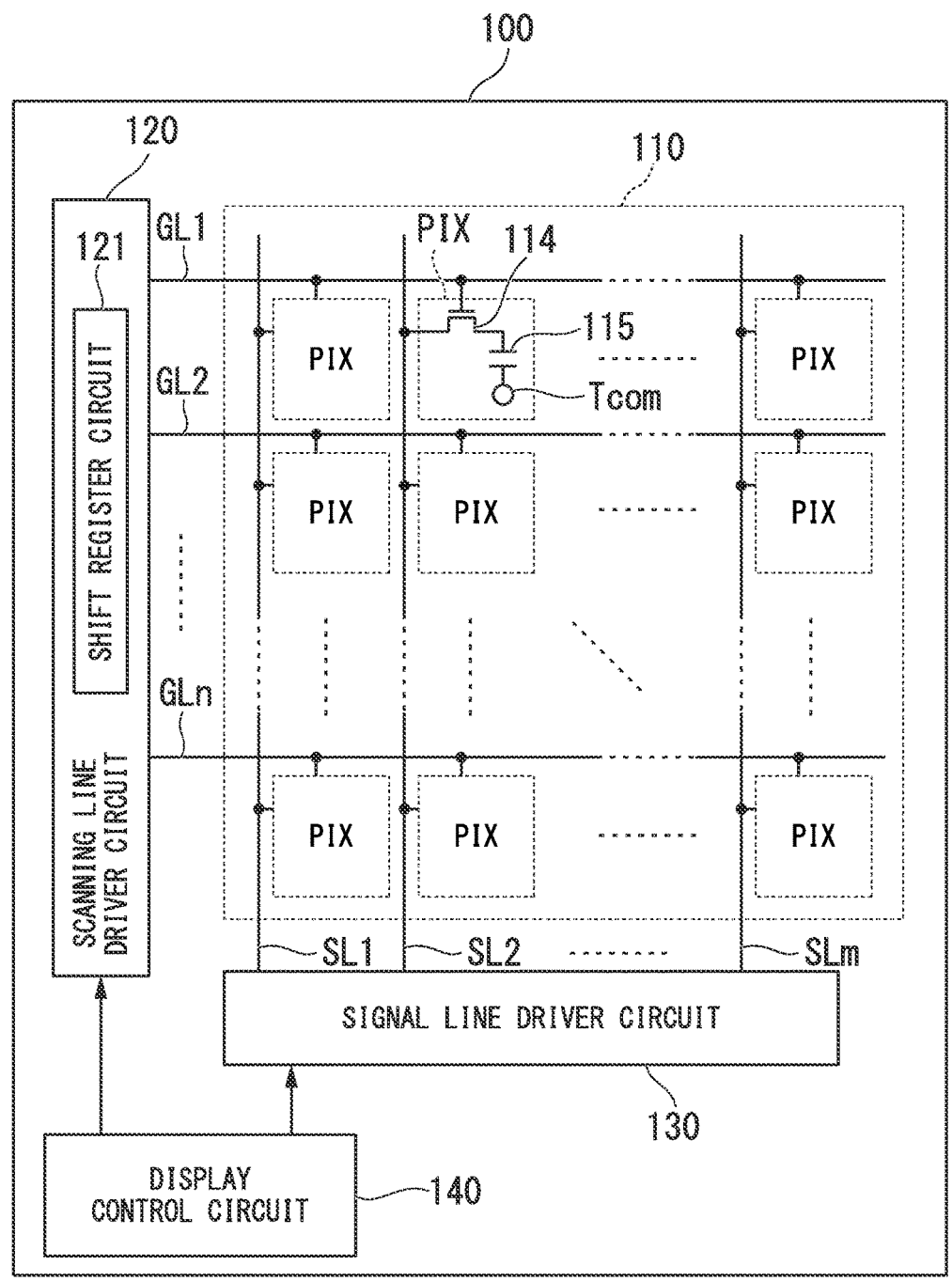
FIG. 1 is a schematic block diagram showing an example of a configuration of a display device according to a first embodiment of the present invention.

FIG. 1 is a schematic block diagram showing an example of a configuration of the display apparatus 100 according to the first embodiment of the present invention. As shown in FIG. 1, the display device 100 is an active matrix liquid crystal display device. The display device 100 includes a display unit 110, a scanning line driver circuit (driver unit) 120, a signal line driver circuit 130, and a display control circuit (control unit) 140.

The display unit 110 includes a plurality of signal lines SL1, SL2, . . . , and SLm (m: natural number) arranged in a horizontal line direction, a plurality of scanning lines GL1, GL2, . . . , and GLn (n: natural number) arranged in a vertical line direction, and a plurality of pixel units PIX.

The pixel units PIX are arranged in a matrix so as to be positioned at intersections of the signal lines SL1, SL2, . . . , SLm and the scanning lines GL1, GL2, . . . , GLn. The pixel units PIX form a display area of the display device 100. Additionally, each of the plurality of pixel units PIX includes a liquid crystal material (not shown) disposed between two substrates, a pixel TFT (Thin Film Transistor: TFT) 114 provided on the substrate, a pixel capacitor unit 115 formed of the liquid crystal material, and a common electrode (transparent electrode) Tcom.

Regarding the pixel TFT 114, a gate is connected to the scanning line GLp (p: an arbitrary integer such that $1 \leq p \leq n$) passing the above-described intersection, a source is connected to the signal line SLq (q: an arbitrary integer such that $1 \leq q \leq m$), and a drain is connected to a first terminal of the pixel capacitor unit 115. A second terminal of the pixel capacitor unit 115 is the common terminal Tcom. The pixel capacitor unit 115 stores a voltage corresponding to each pixel value (gradation value) based on data signals to display an image (picture) on the display device 100.

In the present embodiment, the pixel TFT 114 is an N-channel-type field effect transistor. The pixel TFT 114 is not limited to a thin film transistor, and may be any type of transistor.

As a material of a semiconductor layer of the pixel TFT 114, an oxide semiconductor can be used. The oxide semiconductor layer is, for example, an In—Ga—Zn—O-based semiconductor layer. The oxide semiconductor layer includes, for example, an In—Ga—Zn—O-based semiconductor. Here, the In—Ga—Zn—O-based semiconductor is a ternary oxide of In (indium), Ga (gallium), and Zn (zinc). A ratio (composition ratio) of In, Ga, and Zn is not particularly limited, and includes, for example, In:Ga:Zn=2:2:1, In:Ga:Zn=1:1:1, In:Ga:Zn=1:1:2, and the like. In the present embodiment, an In—Ga—Zn—O based semiconductor film containing In, Ga, and Zn in a ratio of, for example, 1:1:1, is used.

A TFT having an In—Ga—Zn—O-based semiconductor layer has a high mobility (more than 20-fold higher as compared to that of a-SiTFT) and a low leakage current (less than one hundredth as compared to that of a-SiTFT). For this reason, such a TFT is suitably used as a driving TFT and a pixel TFT. By using a TFT having an In—Ga—Zn—O-based semiconductor layer, it becomes possible to significantly reduce power consumption of the display device.

The In—Ga—Zn—O-based semiconductor may be amorphous, and may include a crystalline portion and thus have crystallinity. As the crystalline In—Ga—Zn—O-based semiconductor, a crystalline In—Ga—Zn—O-based semiconductor having a c-axis oriented substantially perpendicular to a layer plane is preferred. A crystal structure of such an In—Ga—Zn—O-based semiconductor is disclosed in, for example, Japanese Patent Application Laid-Open Publication No. 2012-134475. For reference, the present specification incorporates herein all the disclosure of Japanese Patent Application Laid-Open Publication No. 2012-134475.

The oxide semiconductor layer may contain another oxide semiconductor, in place of the In—Ga—Zn—O-based semiconductor. For example, the oxide semiconductor layer may contain a Zn—O-based semiconductor (ZnO), an In—Zn—O-based semiconductor (IZO (registered trademark)), a Zn—Ti—O-based semiconductor (ZTO), a Cd—Ge—O-based semiconductor, a Cd—Pb—O-based semiconductor, a CdO (cadmium oxide), a Mg—Zn—O-based-semiconductor, an In—Sn—Zn—O-based semiconductor (e.g., $In_2O_3$—$SnO_2$—ZnO), an In—Ga—Sn—O-based semiconductor, and the like.

The same applies to a later-described peripheral circuit TFT, and the like.

The scanning line driver circuit 120 includes a shift register circuit 121. The scanning line driver circuit 120 is a circuit that sequentially supplies scanning signals (later-described gate signals G1, G2, ..., and Gn) from the shift register circuit 121 to the scanning lines GL1, GL2, ..., and GLn. In response to each scanning signal, the pixel units PIX on the corresponding horizontal line are driven. The shift register circuit 121 sequentially shifts a gate start pulse signal (later-described start pulse signal GSP) in synchronization with clock signals (later-described clock signals GCK1 and GCK2). Thereby, the scanning line driver circuit 120 outputs scanning signals at predetermined time intervals to the respective scanning lines GL1, GL2, ..., and GLn.

The shift register circuit 121 includes an output transistor (a later-described TFT 1213) for driving the scanning lines GL1, GL2, ..., and GLn connected to the pixel units PIX constituting the display unit 110. In the present embodiment, as will be described later, a bias state of the output transistor of the shift register circuit 121 is controlled, thereby suppressing the shift of the threshold voltage Vth, and thus suppressing deterioration of the display performance. The details of the shift register circuit 121 will be described later.

In the present embodiment, the scanning line driver circuit 120 includes a peripheral circuit TFT formed on the same glass substrate on which the above-described pixel TFTs 114 are formed. Here, similar to the pixel TFT 114, the peripheral circuit TFT is an N-type transistor. As a material of the semiconductor layer, similar to the pixel TFT 114, for example, an oxide semiconductor such as In—Ga—Zn—O can be used. However, the peripheral circuit TFT is not limited to a thin film transistor, and may be any type of transistor.

The signal line driver circuit 130 is a circuit that generates a data signal supplying to each pixel unit PIX, a voltage corresponding to a pixel value (gradation value), and outputs the generated data signal to the signal lines SL1, SL2, ..., and SLm. The signal line driver circuit 130 supplies a data signal for one horizontal line to the respective pixel units PIX via the signal lines SL1, SL2, ..., and SLm, in synchronism with the driving by the scanning line driver circuit 120 of the scanning lines GL1, GL2, ..., and GLn.

The display control circuit 140 is configured to generate various control signals required to display an image on the display unit 110 and supply the generated control signals to the scanning line driver circuit 120 and the signal line driver circuit 130. In the present embodiment, the display control circuit 140 supplies in an image display period, a signal for displaying an image on the display unit 110, to the scanning line driver circuit 120 and the signal line driver circuit 130. Additionally, the display control circuit 140 controls the bias state of the above-described output transistor in a display suspension period so that an absolute value of the threshold voltage Vth of the output transistor (later-described TFT 1213) of the scanning line driver circuit 120, which has been increased in the display period due to the voltage stress and the like, decreases.

The control signals to be supplied to the scanning line driver circuit 120 include, for example, a gate start pulse signal (GSP), a gate shift clock signal (GSC), and a gate output enable signal (GOE). Additionally, the control signals to be supplied to the signal line driver circuit 130 include, for example, a source start pulse (SSP), a source shift clock signal (SSC), a source output enable signal (SOE), a polarity control signal (POL), and the like.

Next, a configuration of the shift register circuit 121 according to the first embodiment will be described with reference to FIG. 2.

Figure 2:
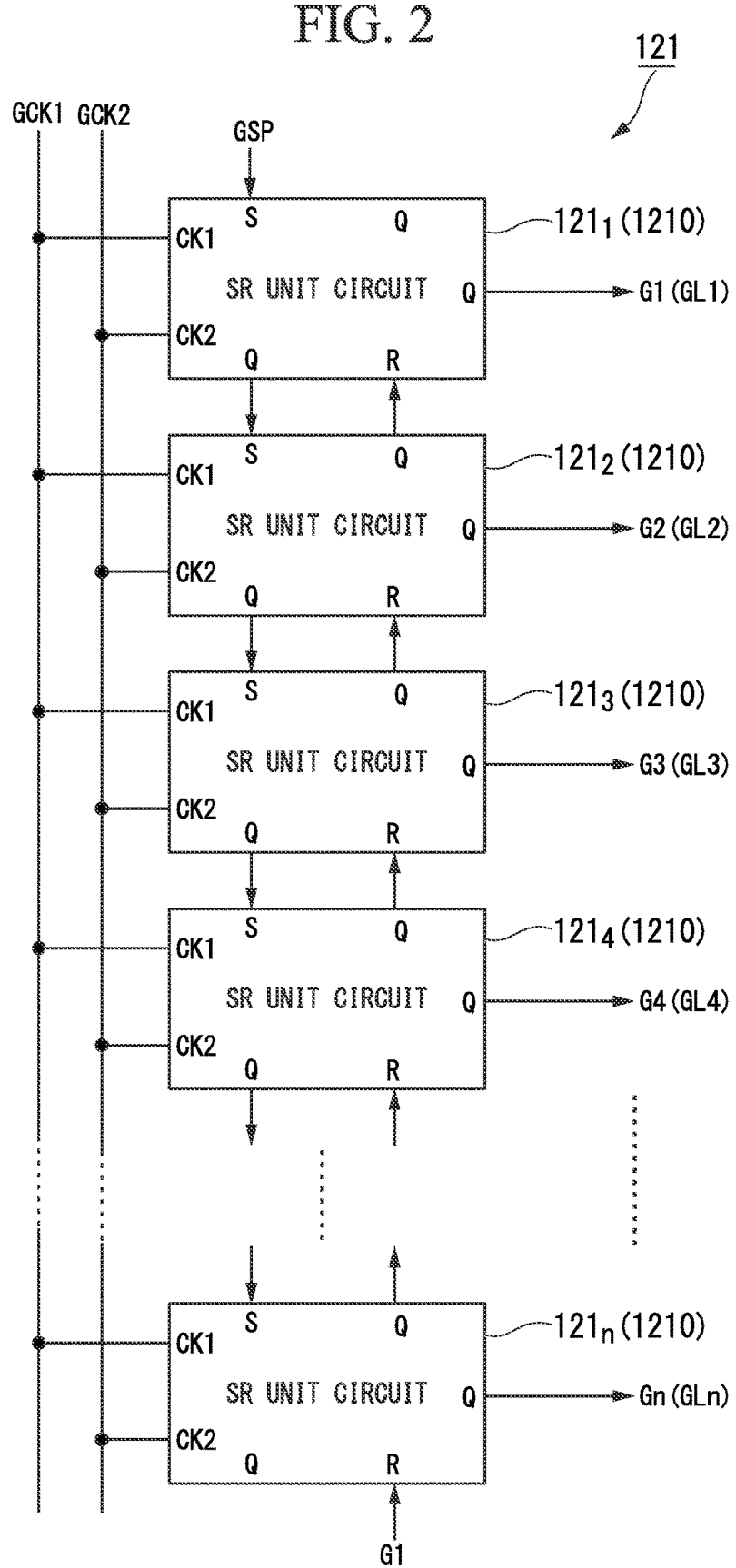
FIG. 2 is a schematic block diagram showing an example of a configuration of a shift register circuit according to the first embodiment.

FIG. 2 is a schematic block diagram showing an example of a configuration of the shift register circuit 121 according to the first embodiment. As shown in the figure, the shift register circuit 121 includes a plurality of shift register unit circuits (SR unit circuits) $121_1$, $121_2$, $121_3$, $121_4$, ..., and $121_n$ corresponding to the plurality of scanning lines GL1, GL2, GL3, GL4, ..., and GLn. The plurality of shift register unit circuits $121_1$, $121_2$, $121_3$, $121_4$, ..., and $121_n$ are connected in cascade.

Upon receiving a gate start pulse signal GSP from the display control circuit 140, the shift register unit circuits $121_1$, $121_2$, $121_3$, $121_4$, ..., and $121_n$ perform shift operation based on the clock signals GCK1 and GCK2 supplied from the signal line driver circuit 130, and sequentially outputs the gate signals G1, G2, G3, G4, ..., and Gn to the scanning lines GL1, GL2, GL3, GL4, ..., and GLn. A phase of the clock signal GCK1 and a phase of the clock signal GCK2 differ by 180 degrees from each other, as shown in later-described FIG. 6.

In the present embodiment, the plurality of respective shift register unit circuits $121_1$, $121_2$, $121_3$, $121_4$, ..., and $121_n$ function as a kind of master-slave-type flip-flop that transfers signals in synchronization with the clock signals GCK1 and GCK2. Each of the plurality of shift register unit circuits $121_1$, $121_2$, $121_3$, $121_4$, ..., and $121_n$ has the same configuration. Hereinafter, as appropriate, when referring to each of the shift register unit circuit $121_1$, $121_2$, $121_3$, $121_4$, ..., and $121_n$, each shift register unit circuit will be referred to as a "shift register unit circuit 1210."

The shift register unit circuit 1210 includes clock terminals CK1 and CK2, a set terminal S, a reset terminal R, and an output terminal Q. The clock terminal CK1 is connected with a signal line of the clock signal GCK1. Additionally, the clock terminal CK2 of the shift register unit circuit 1210 is connected with a signal line of the clock signal GCK2.

In the shift register unit circuit $121_1$, the set terminal S is connected with a signal line of the gate start pulse signal GSP, and the reset terminal R is connected with a signal line (scanning line GL2) of the output terminal Q of the shift register unit circuit $121_2$ in the next stage. Additionally, in the shift register unit circuit $121_1$, the output terminal Q is connected with the scanning line GL1 and the set terminal S of the shift register unit circuit $121_2$ in the next stage.

In the shift register unit circuit $121_2$, the set terminal S is connected with the output terminal Q (scanning line GL1) of the shift register unit circuit $121_1$ in the previous stage, and the reset terminal R is connected with a signal line (scanning line GL3) of the output terminal Q of the shift register unit circuit $121_3$ in the next stage. Additionally, in the shift register unit circuit $121_2$, the output terminal Q is connected with the scanning line GL2, the set terminal S of the shift register unit circuit $121_3$ in the next stage, and the reset terminal R of the shift register unit circuit $121_1$ in the previous stage.

In a similar manner, in the shift register unit circuits $121_3$, ..., and $121_n$, the set terminal S is connected with the signal line of the output terminal Q of the shift register unit circuit in the previous stage, the reset terminal R is connected with the signal line of the output terminal Q of the shift register unit circuit in the next stage, and the output terminal Q is connected with the scanning line GL3, ..., and GLn.

Here, the reset terminal R of the shift register unit circuit $121_n$ in the last stage receives the gate signal G1 from the output terminal Q of the shift register unit circuit $121_1$ in the first stage.

Thus, the shift register circuit 121 includes the plurality of shift register unit circuits $121_1$, $121_2$, $121_3$, $121_4$, ..., and $121_n$ connected in cascade. Additionally, the shift register circuit 121 is configured to output, as the gate signals G1, G2, G3, G4, ..., and Gn, the output signals of these shift register unit circuits $121_1$, $121_2$, $121_3$, $121_4$, ..., and $121_n$ sequentially to the scanning lines GL1, GL2, GL3, GL4, ..., and GLn.

Next, a configuration of the shift register unit circuit 1210 according to the present embodiment will be described with reference to FIG. 3.

Figure 3:
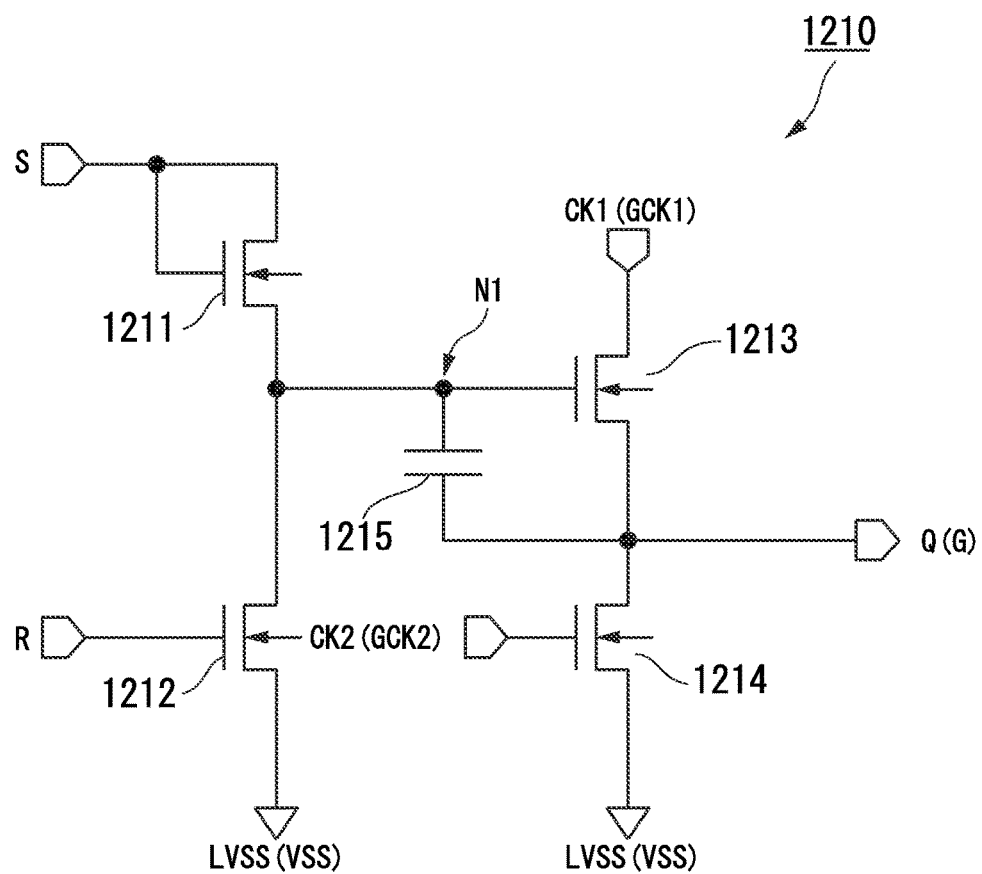
FIG. 3 is a circuit diagram showing an example of a configuration of a shift register unit circuit according to the first embodiment.

FIG. 3 is a circuit diagram showing an example of the configuration of the shift register unit circuit 1210 according to the first embodiment. As shown in the figure, the shift register unit circuit 1210 includes TFTs 1211, 1212, 1213, and 1214, and a capacitor 1215. The TFTs 1211, 1212, 1213, and 1214 are the above-described peripheral circuit TFTs, for example, N-channel-type thin film transistors using an oxide semiconductor such as In—Ga—Zn—O.

Regarding the TFT 1211, a drain and a gate are connected to the set terminal S, and a source is connected to a node N1. The TFT 1211 functions as a diode. When a logic state of the signal of the set terminal S becomes a High state (hereinafter referred to as a "high level"), the TFT 1211 supplies to the node N1, a voltage decreased by the threshold voltage of the TFT 1211 from a referential voltage indicating the high level which is supplied to the set terminal S.

Regarding the TFT 1212, a drain is connected to the node N1, a gate is connected to the reset terminal R, and a source is connected to a low power supply line LUSS that supplies a low power supply voltage VSS. The low power supply voltage VSS is a voltage used as a reference for the operation of the shift register unit circuit 1210. In the present embodiment, the low supply voltage VSS is a voltage VGL (e.g., −15V) having a negative polarity which is to be generated by a later-described booster circuit 132. When the signal of the reset terminal R becomes at the high level, the TFT 1212 enters a conducted state node N1 and drives the node N1 to a Low state (hereinafter referred to as a "low level"). This low level is a logic state that is lower in voltage than the high level. Additionally, the voltage at this low level becomes the low power supply voltage VSS. The TFT 1212 enters a non-conducted state when the signal of the reset terminal R becomes at the low level.

The TFT 1213 is an output transistor for outputting a pulse signal to the output terminal Q. Regarding the TFT 1213, a drain is connected to the clock terminal CK1, a gate is connected to the node N1, and a source is connected to the output terminal Q. In the display device 100, the voltage stress to be applied to the TFT 1213 is the severest and greatly affects the display performance. Therefore, in the present embodiment, the bias state of the TFT 1213 is controlled in the display suspension period, thereby restoring the threshold voltage Vth of the TFT 1213 shifted by the voltage stress in the display period.

The TFT 1214 is a transistor for controlling a conduction state between the low power supply line LVSS and the output terminal Q. Regarding the TFT 1214, a drain is connected to the output terminal Q, a gate is connected to the clock terminal CK2, and a source is connected to the low power supply line LVSS. When the signal of the clock terminal CK2 becomes at the high level, the TFT 1214 enters the conducted state, thereby making the signal level of the output terminal Q at the low level. Additionally, the TFT 1214 enters a non-conducted state when the signal level of the clock terminal CK2 becomes at the low level. In a case where the TFT 1214 is in the non-conducted state and the TFT 1213 is in the conducted state, a signal of the clock terminal CK1 is transferred to the output signal Q via the TFT 1213.

The capacitor 1215 is a bootstrap capacitor connected between the node N1 and the output terminal Q. The capacitor 1215 transfers a variation in voltage of the output terminal Q to the node N1, and increases the voltage at the node N1 to a voltage higher than a sum of the voltage of the output terminal Q indicating the high level and the threshold voltage of the TFT 1213. This operation is referred to as bootstrap operation. The TFT 1213 transfers, by the bootstrap operation, the high level of the signal at the clock terminal CK1 to the output terminal Q without causing a voltage drop due to the threshold voltage Vth of the TFT 1213.

The shift register unit circuit 1210 having such a configuration, apparently, captures a signal at the set terminal S at a timing synchronized with the clock signal GCK2 inputted to the clock terminal CK2, and transfers the captured signal to the output terminal Q at a timing synchronized with the clock signal GCK1 inputted to the clock terminal CK1. Thus, the shift register unit circuit 1210 functions as a so-called master-slave-type flip-flop.

Next, the signal line driver circuit 130 will be described with reference to FIGS. 4 and 5.

Figure 4:
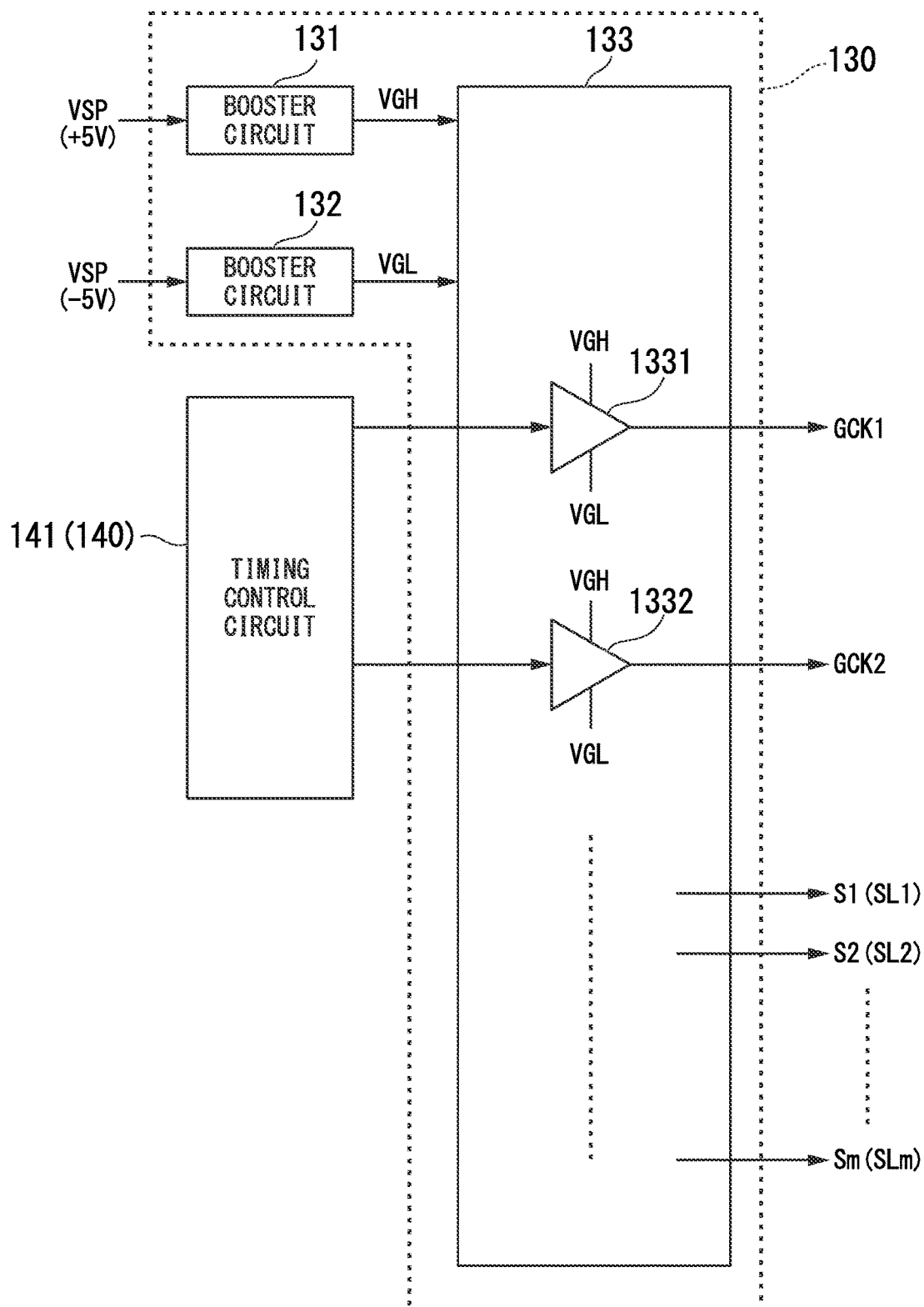
FIG. 4 is a schematic block diagram showing an example of a configuration of a signal line driver circuit according to the first embodiment.
Figure 5:
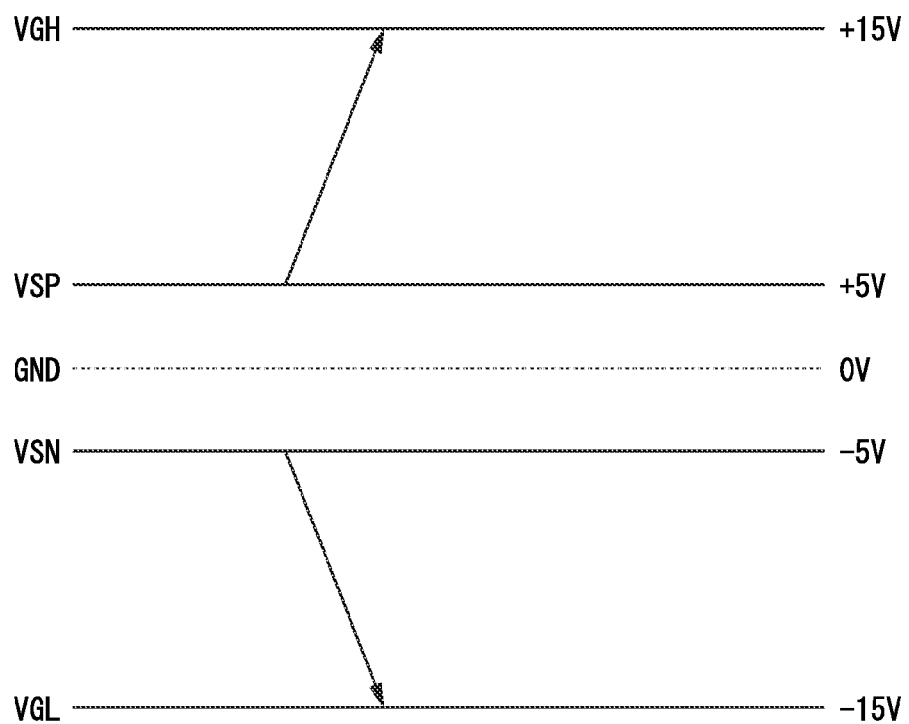
FIG. 5 is an explanatory diagram illustrating boosting operation of the signal line driver circuit according to the first embodiment.

FIG. 4 is a schematic block diagram showing an example of a configuration of the signal line driver circuit 130 in the first embodiment, and mainly showing a portion related to generation of the clock signals GCK1 and GCK2 to be supplied to the above-described scanning line driver circuits 120. Additionally, FIG. 5 is an explanatory diagram illustrating the boosting operation of the signal line driver circuit 130 according to the first embodiment.

In FIG. 4, the signal line driver circuit 130 includes booster circuits 131 and 132, and a driver 133. The booster circuit 131 and 132 are, for example, charge pump circuits. The booster circuit 131 of these circuits is configured to boost a voltage (e.g., +5V) supplied from an external VSP, thereby generating a positive voltage VGH (e.g., +15V), as shown in FIG. 5. Meanwhile, the booster circuit 132 is configured to boost a voltage VSN (e.g., −5V) supplied from the outside, thereby generating a negative voltage VGL (e.g., −15V).

Referring back to FIG. 4, a description continues. The driver unit 133 includes a plurality of drivers 1331, 1332, ..., and the like. Each driver operates in accordance with a timing signal to be supplied from the timing control circuit 141 included in the above-described display control circuit 140, using as a power supply voltage, a difference voltage between the positive voltage VGH and the negative voltage VGL which are generated by the booster circuits 131 and 132. A high level and a low level of the respective output signals from the drivers 1331 and 1332 are respectively given by the positive voltage VGH and the negative voltage VGL.

In other words, in accordance with the timing signal to be supplied from the timing control circuit 141, the driver 1331 outputs the clock signal GCK1 having the high level given by the positive voltage VGH and the low level given by the negative voltage VGL. Although the same applies to the driver 1332, a phase of the clock signal GCK2 output from the driver 1332 differs by 180 degrees from a phase of the clock signal GCK1 output from the buffer 1331.

Although not shown in FIG. 4, the driver unit 133 includes, in addition to the drivers 1331 and 1332, a plurality of drivers for outputting data signals S1, S2, . . . , and Sm in accordance with gradation values of the respective pixels in one horizontal line, based on the image signal to be supplied from the above-described display control circuit 140. The plurality of drivers for outputting these data signals S1, S2, . . . , and Sm can be realized by a known technique, and a detailed description thereof is omitted here. (Description of Operation)

Next, operation of the display device 100 according to the present embodiment will be described.

Operational characteristics of the display device 100 according to the present embodiment is in operation of the scanning line driver circuit 120 based on the control by the display control circuit 140, and other operations are basically similar to the operation of conventional devices. For this reason, hereinafter, the operation of the scanning line driver circuit 120 based on the control by the display control circuit 140 will be described in detail.

Figure 6:
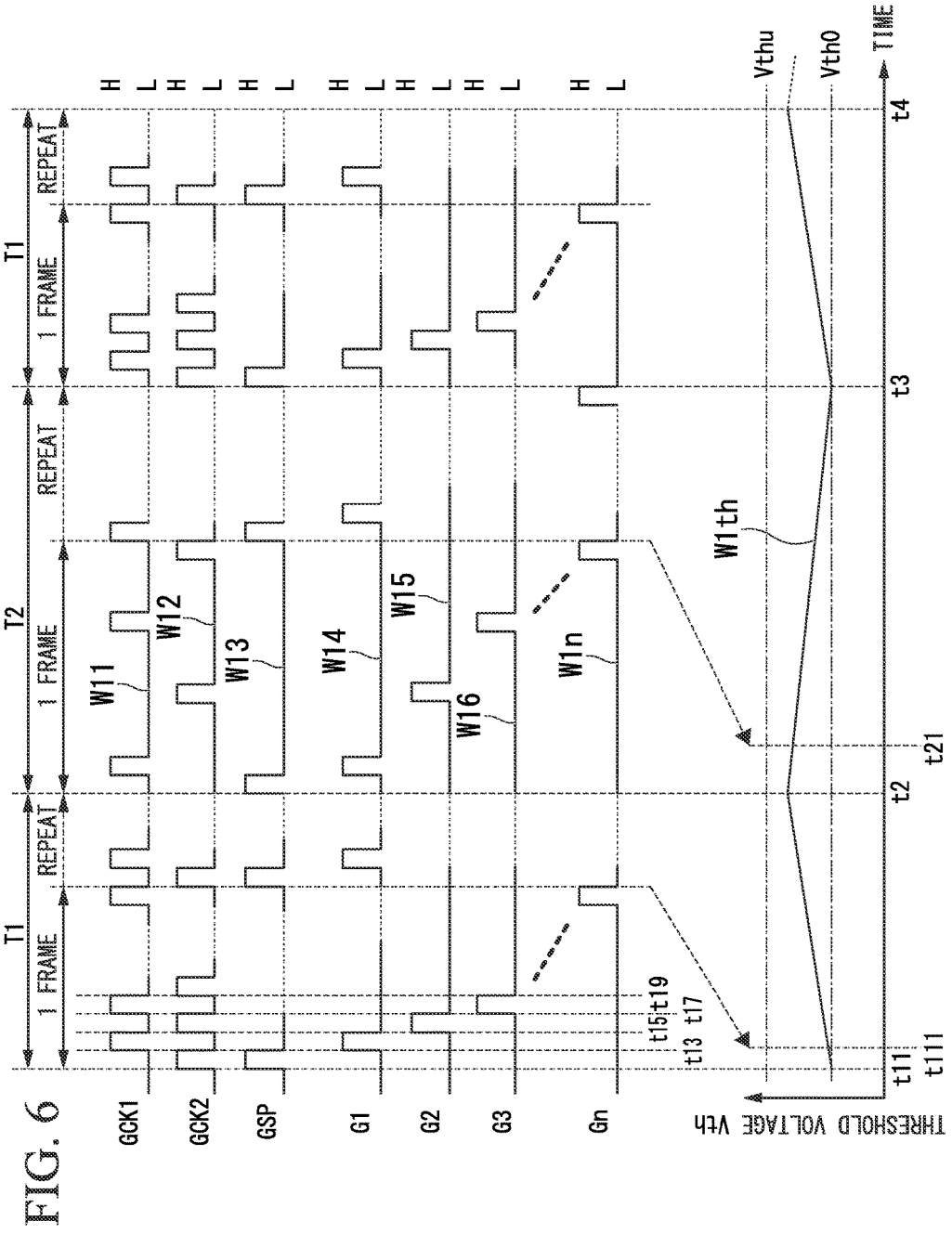
FIG. 6 is a time chart showing an example of operation of the shift register circuit according to the first embodiment.

FIG. 6 is a time chart showing an example of operation of the shift register circuit 121 (FIG. 2) constituting the scanning line driver circuit 120. In the figure, waveforms W11, W12, and W13 respectively represent a voltage waveform of the above-described clock signal GCK1, a voltage waveform of the clock signal GCK2, and a voltage waveform of the gate start pulse signal GSP. Additionally, waveforms W14, W15, . . . , and W1n respectively represent voltage waveforms of the gate signals G1, G2, . . . , and Gn. Further, a waveform W1th represents a waveform of the threshold voltage Vth of the TFT 1213 of the shift register unit circuit 1210 shown in FIG. 3. Moreover, in this figure, a horizontal axis represents time, and a vertical axis represents a signal level (voltage) of each waveform.

Additionally, in FIG. 6, the gate start pulse signal GSP corresponds to the input signal at the set terminal S of the shift register unit circuit $121_1$ in the first stage shown in FIG. 2, which is a signal to be supplied from the display control circuit 140. The gate signal G1 is a signal corresponding to an output signal from the output terminal Q of the shift register unit circuit $121_1$. The gate signal G2 is a signal corresponding to an output signal from the output terminal Q of the shift register unit circuit $121_2$. The gate signal G3 is a signal corresponding to an output signal from the output terminal Q of the shift register unit circuit $121_3$. In a similar manner, the gate signal Gn is a signal corresponding to an output signal from the output terminal Q of the shift register unit circuit $121_n$.

Here, "H" shown in the figure represents the high level, and "L" represents the low level.

It is assumed that before time t11 shown in FIG. 6, the driver 1331 and the driver 1332, which constitute the above-described signal line driver circuit 130, has initiated operation under the control of the timing control circuit 141, thereby having already generated the clock signals GCK1 and GCK2. In the present embodiment, the clock signals GCK1 and GCK2 have the same cycle length. Hereinafter, a term "clock cycle" represents a cycle length of each of the clock signal GCK1 and the clock signal GCK2, and a term "half clock cycle" represents one-half of the clock cycle.

In the normal display period T1 shown in FIG. 6, when the gate start pulse signal GSP transitions from the low level to the high level at time t11 (see the waveform W13), the shift register circuit 121 included in the scanning line driver circuit 120 (FIG. 2) initiates shift operation in synchronization with the clock signals GCK1 and GCK2.

Subsequently, at time t13 which is delayed by a half clock cycle from time t11, in response to the rising of the first clock signal GCK1 after the rising of the gate start pulse signal GSP, the shift register unit circuit $121_1$ causes the gate signal G1 to transition from the low level to the high level, and outputs a pulse signal as the gate signal G1 (see the waveform W14 shown in FIG. 6). The shift register unit circuit $121_1$ outputs the gate signal G1 to the set terminal S of the shift register unit circuit $121_2$ in the next stage.

Subsequently, at time t15 which is delayed by a half clock cycle from time t13, in response to the rising of the first clock signal CK2 after the rising of the gate signal G1, the shift register unit circuit $121_2$ causes the gate signal G2 to transition from the low level to the high level, and outputs a pulse signal as the gate signal G2 (see the waveform W15 shown in FIG. 6). The shift register unit circuit $121_2$ outputs the gate signal G2 to the set terminal S of the shift register unit circuit $121_3$ in the next stage.

In a same manner, in synchronization with the clock signals GCK1 and GCK2, the shift register circuit $121_3$, . . . , and $121_n$ sequentially output pulse signals as the gate signals G3, . . . , and Gn (see waveforms W16, . . . , and W1n shown in FIG. 6). As described above, from time t11 to time t1 11, the gate signals G1, G2, G3, . . . , and Gn for one frame are output. Thereafter, in the display period T1, the gate signals G1, G2, G3, . . . , and Gn are repeatedly outputted for a plurality of frames corresponding to the display image.

Thus, in synchronization with the clock signals GCK1 and GCK2, the shift register circuit 121 performs shift operation of sequentially transferring the high level of the gate start pulse signal GSP from the shift register unit circuit $121_1$ in the first stage toward the shift register unit circuit $121_n$ in the last stage, thereby sequentially outputting as the gate signals G1, G2, G3, . . . , and Gn, a plurality of pulse signals having phases each shifted by the half clock cycle.

During the course of the above-described shift operation in the display period T1, the threshold voltage Vth of the TFT 1213 constituting the shift register unit circuit 1210 shown in FIG. 3, due to the voltage stress, gradually increases from the initial threshold voltage Vth0 toward the upper limit threshold voltage Vthu (see waveform With shown in FIG. 6). Here, the initial threshold voltage Vth0 is the threshold voltage Vth of the TFT 1213 before the voltage stress is applied. Additionally, the upper threshold voltage Vthu is a predetermined upper limit of the threshold voltage Vth of the TFT 1213 which does not affect the image display performance of the display unit 110. Such an increase in threshold voltage Vth is caused in a period in which the gate signals G1, G2, G3, . . . , and Gn become at the high level, and a mechanism thereof will be described later.

Subsequently, at time t2, under control of the timing control circuit 141 constituting the display control unit 140, the driver 1331 and the driver 1332, which constitute the signal line driver circuit 130 (FIG. 4), respectively set only the clock cycles of the clock signal GCK1 and the clock signal GCK2 to values longer than the clock cycle of the display period T1, without changing the respective pulse widths (high-level periods) of the clock signal GCK1 and the clock signal GCK2. Thereby, in a display suspension period T2 subsequent to the display period T1, the respective frequencies of the clock signals GCK1 and GCK2 become values smaller than the frequencies of the clock signals GCK1 and GCK2 in the display period T1.

Specifically, assuming that tck1 represents the respective clock cycles of the clock signals GCK1 and GCK2 in the display period T1, and tck2 represents the respective clock cycles of the clock signals GCK1 and GCK2 in the display period T2, a clock frequency fck1 in the display period T1 is expressed by fck1=1/tck1, and a clock frequency fck2 in the display period T2 is expressed by fck2=1/tck2.

Here, if tck2>tck1, a relationship fck1>fck2 can be obtained. In other words, in the display suspension period T2 subsequent to the display period T1, the frequency fck2 of the clock signals GCK1 and GCK2 becomes smaller than the frequency fck1 of the clock signals GCK1 and GCK2 in the display period T1. In the example shown in FIG. 6, the frequency fck2 of the clock signals GCK1 and GCK2 in the display suspension period T2 is set to approximately a quarter of the clock frequency fck1 of the clock signals GCK1 and GCK2 in the display period T1. For this reason, a period from time t2 to time t21 which corresponds to one frame in the display suspension period T2 becomes approximately four times a period from time t11 to time t111 which corresponds to one frame in the display period T1. Thus, for each frame in the display suspension period T2, the display control circuit 140 has the signal line driver circuit 130 repeatedly supply to the scanning line driver circuit 120, as the clock signals GCK1 and GCK2, a signal of the frequency lower than the frequencies of the clock signals GCK1 and GCK2 to be supplied to the scanning line driver circuit 120 in the display period T1.

In both the display period T1 and the display suspension period T2, the increase in threshold voltage Vth of the TFT 1213 is caused in the period in which the gate signals G1, G2, . . . , and Gn become at the high level. However, if the clock frequency fck2 in the display suspension period T2 is set to a value smaller than the clock frequency fck1 in the display period T1, the gate signals G1, G2, . . . , and Gn are less likely to become at the high level in the display suspension period T2 than in the display period T1. For this reason, the voltage stress applied to the gate of the TFT 1213 more decreases in the display suspension period T2 than in the display period T1. When the voltage stress applied to the TFT 1213 decreases, the number of electrons emitted from the gate insulating film of the TFT 1213 comes to exceed the number of electrons injected into the gate insulating film of the TFT 1213, as will be described later. Consequently, in the display suspension period T2, the threshold voltage Vth of the TFT 1213 gradually decreases toward the initial threshold voltage Vth0 (see waveform With shown in FIG. 6).

Here, the degree of the decrease in threshold voltage Vth of the TFT 1213 is dependent on the clock frequency fck2 of the clock signals GCK1 and GCK2 in the display suspension period T2. For this reason, the clock frequency fck2 is set appropriately so that, for example, the threshold voltage Vth of the TFT 1213 is restored to the initial threshold voltage Vth0 within a desired period included in the display suspension period T2.

Next, operation of the shift register unit circuit 1210 shown in FIG. 3 will be described with reference to FIG. 7.

Figure 7:
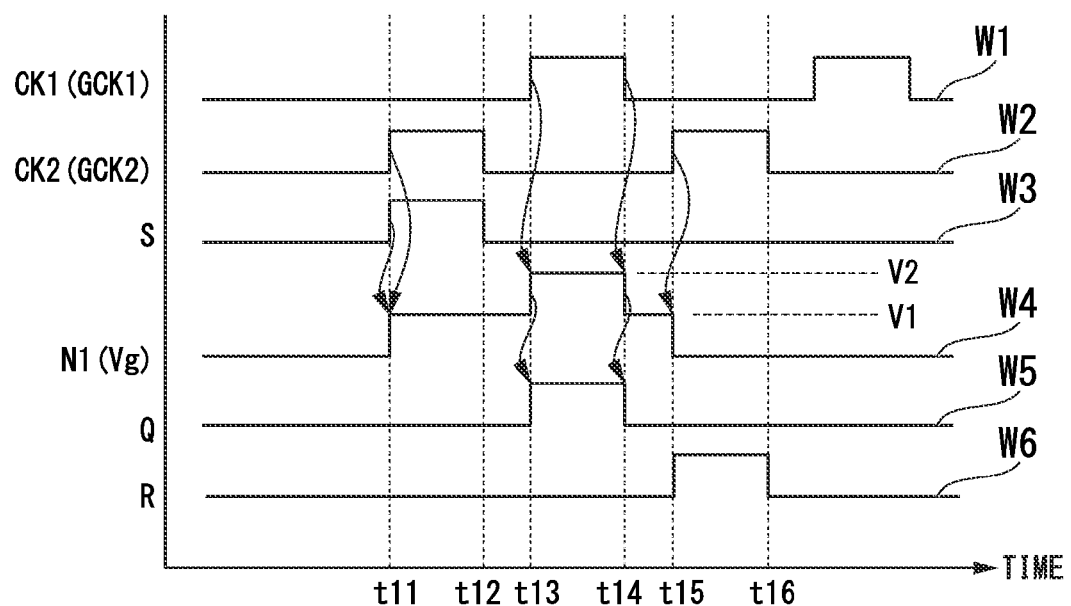
FIG. 7 is a time chart showing an example of operation of the shift register unit circuit according to the first embodiment.

FIG. 7 is a time chart showing an example of the operation of the shift register unit circuit 1210 according to the first embodiment. In the figure, waveforms W1, W2, W3, W4, W5, and W6 respectively represent a voltage waveform of the clock signal GCK1 to be inputted to the clock terminal CK1, a voltage waveform of the clock signal GCK2 to be inputted to the clock terminal CK2, a voltage waveform of the pulse signal to be inputted to the set terminal S, a voltage waveform at the node N1, a voltage waveform of the output signal from the output terminal Q, and a voltage waveform of the pulse signal to be inputted to the reset terminal R.

In FIG. 7, V1 represents a voltage decreased by the threshold voltage Vth of the TFT 1213 from the high level of the pulse signal to be inputted to the set terminal S. Additionally, V2 represents a voltage increased by an inter-terminal voltage of the capacitor 1215 from the referential voltage V1 in the bootstrap operation. Further, V2 is a voltage higher than a sum of the high level voltage of the clock signal GCK1 to be inputted to the clock terminal CK1 and the threshold voltage Vth of the TFT 1213. The voltage at the node N1 corresponds to a gate voltage Vg to be applied to the gate of the TFT 1213. Times t11, t13, and t15 shown in FIG. 7 correspond respectively to the above-described times t11, t13, and t15 shown in FIG. 1.

For convenience of explanation, it is assumed that respective signal levels of the clock terminals CK1 and CK2, the set terminal S, the node N1, the output terminal Q, and the reset terminal R are the low level in the initial state before time t11. From this initial state, when the pulse signal of the set terminal S transitions from the low level to the high level at time t11, the TFT 1211 of the shift register unit circuit 1210 enters the conducted state, and the TFT 1211 supplies the voltage V1 to the node N1 (see the reference waveform W4 shown in FIG. 7). Thus, the TFT 1211 pre-charges the capacitor 1215 connected to the node N1. Here, the voltage V1 is a voltage which is lower by the threshold voltage Vth of the TFT 1211 than the high level of the pulse signal at the set terminal S, but which is high level as a signal level of the binary logic.

When the node N1 becomes at the voltage V1 at time t11, the gate voltage Vg indicating the high level is applied to the gate terminal of the TFT 1213. Thus, the TFT 1213 enters the conducted state. At this time, the signal level of the clock signal GCK2 at the clock terminal CK2 is the low level, and therefore the TFT 1214 is in the non-conducted state. Thus, even if the TFT 1214 is in the non-conducted state, and the TFT 1213 enters the conducted state, the clock signal GCK1 at the clock terminal CK1 is at the low level at time t11, and therefore the signal level of the output terminal Q of the shift register unit circuit 1210 maintains at the low level.

Subsequently, when the pulse signal at the set terminal S transitions from the high level to the low level at time t12, the TFT 1211 enters the non-conducted state, and the TFT 1211 terminates the pre-charge of the node N1. Even if the pre-charge of the node N1 is terminated, the voltage V1 of the node N1 is stored by a capacitor component such as the capacitor 1215, and therefore the TFT 1213 is maintained in the conducted state.

Subsequently, when the pulse signal of the clock terminal CK1 transitions from the low level to the high level at time t13, the high level of this signal is transferred to the output terminal Q via the TFT 1213, and the TFT 1213 initiates outputting the high level to the output terminal Q. At this time, the signal level of the output terminal Q transitions from the low level to the high level, thereby causing the voltage of the node N1 to be increased to the voltage V2 via the capacitor 1215 (bootstrap operation). By the bootstrap operation, the TFT 1213 transfers the high level of the clock signal GCK1 at the clock terminal CK1 to the output terminal Q without causing a voltage drop.

Next, when the clock signal GCK1 at the clock terminal CK1 transitions from the high level to the low level at time t14, the low level is transferred to the output terminal Q via the TFT 1213, and the TFT 1213 initiates outputting the low level to the output terminal Q. In this case, the signal level of the output terminal Q transitions from the high level to the low level, thereby causing the voltage of the node N1 to be decreased to the original voltage V1 via the capacitor 1215.

Thus, the shift register unit circuit 1210 outputs the high-level pulse signal to the output terminal Q in the period from time t13 to time t14, as indicated by the voltage waveform W5 shown in FIG. 7. At time t14, the signal level of the output terminal Q becomes the low level.

Subsequently, at time t15, when the pulse signal at the reset terminal R transitions from the low level to the high level, the TFT 1212 enters the conducted state. Thus, the TFT 1212 initiates discharge of the capacitor 1215 connected to the node N1 and drives the signal level of the node N1 to the low level. By the signal level of the node N1 becoming at the low level, a gate voltage Vg indicating the low level is applied to the gate terminal of the TFT 1213. Consequently, the TFT 1213 enters the non-conducted state. Additionally, when the clock signal GCK2 at the clock terminal CK2 transitions from the low level to the high level at time t15, the TFT 1214 enters the conducted state. Thus, the signal level of the output terminal Q is maintained at the low level.

Next, when the pulse signal of the reset terminal R transitions from the high level to the low level at time t16, the TFT 1212 enters the non-conducted state, the TFT 1212 terminates the discharge of the capacitor 1215 connected to the node N1. Thereby, the circuit state of the shift register unit circuit 1210 is returned to the initial state, and the shift register unit circuit 1210 prepares for the next operation.

Thus, the shift register unit circuit 1210 captures the signal level of the pulse signal supplied from the shift register unit circuit in the previous stage to the set terminal S, in synchronization with the clock signals GCK1 and GCK2 supplied to the clock terminals CK1 and CK2. Then, the shift register unit circuit 1210 outputs and transfers the captured signal level from the output terminal Q to the shift register unit circuit in the next stage. Consequently, the shift register unit circuit 1210 apparently functions as a master-slave type flip-flop.

Here, in FIG. 7, the period from time t11 to time t13 is, for example, a period corresponding to a 1H period of the display device 100 (data writing period for one horizontal line).

Next, a mechanism in which the threshold voltage Vth of the TFT 1213 shifts (increases/decreases) will be described with reference to FIGS. 8A, 8B, 9A, and 9B.

Figure 8A:
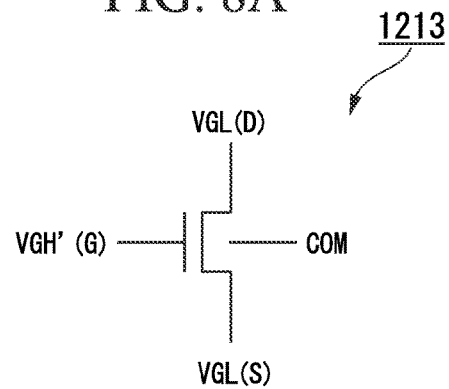
FIG. 8A is a first explanatory diagram illustrating a mechanism that a threshold voltage of a TFT varies (mechanism that the threshold voltage increases) according to the first embodiment.
Figure 8B:
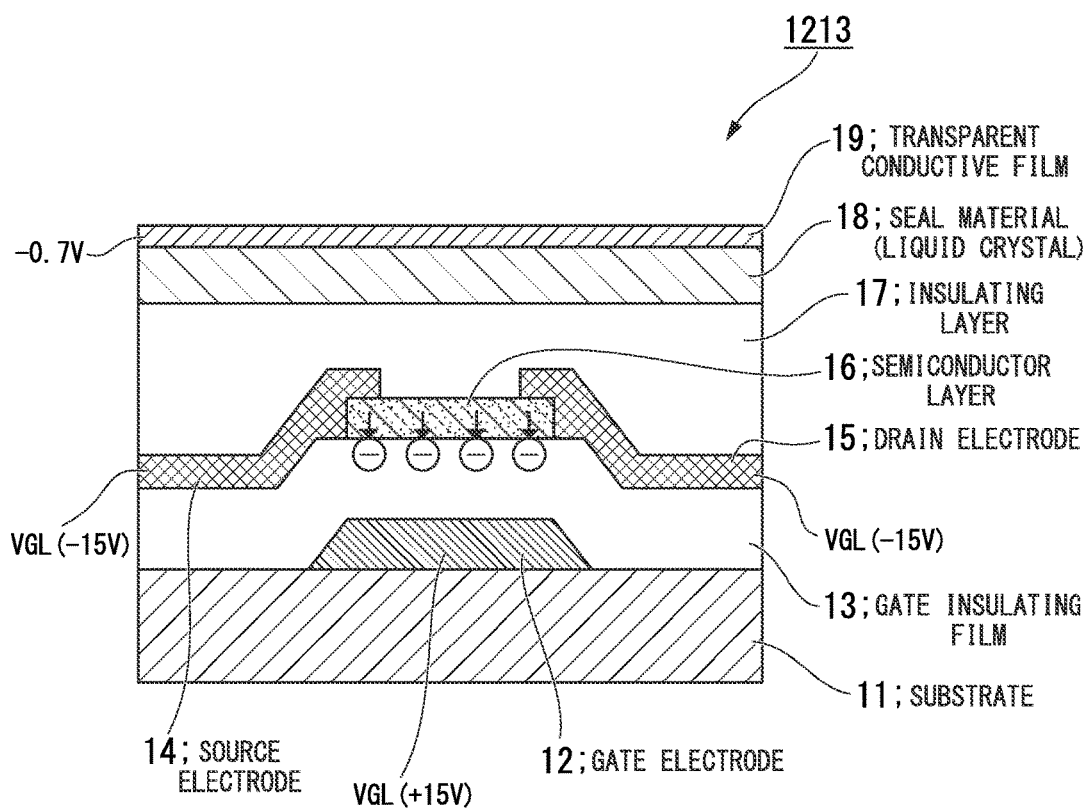
FIG. 8B is a second explanatory diagram illustrating the mechanism that the threshold voltage of the TFT varies (mechanism that the threshold voltage increases) according to the first embodiment.

FIGS. 8A and 8B are explanatory diagrams illustrating the mechanism in which the threshold voltage Vth of the TFT according to the first embodiment shifts, and illustrating a mechanism in a case where the threshold voltage Vth increases. As described above, the increase in threshold voltage Vth of the TFT 1213 is caused in the period in which the gate signals G1, G2, . . . , and Gn become at the high level.

Particularly, in a period from time t12 to time t13 shown in FIG. 7 which is immediately before the boost operation, the gate electrode (G) of the TFT 1213 is applied with, as the voltage V1, a voltage VGH' (e.g., approximately +14V) obtained by subtracting the threshold voltage of the TFT 1211 from the voltage VGH (e.g., +15V) corresponding to the high level of the pulse signal inputted to the set terminal S, as shown in FIG. 8A. Additionally, the source electrode (S) and the drain electrode (D) enter a state of being applied with the voltage VGL (e.g., −15V) corresponding to the low level of the clock signal GCK1 applied to the clock terminal CK1. In this state, the voltage stress of the TFT 1213 becomes maximized.

Here, in FIG. 8A, a symbol "COM" represents the common terminal Tcom (FIG. 1). Generally, in order to compensate a fluctuation in voltage of the pixel electrode due to the coupling capacitance between the gate and the source and drain of the pixel TFT, the common terminal Tcom is usually applied with a voltage Vcom (e.g., −0.7V) corresponding to the variation in voltage, at the time of injection of charge to the pixel.

FIG. 8B is a cross-sectional view illustrating a moving state of electrons when the threshold voltage Vth of the TFT 1213 increases. As shown in FIG. 8B, the TFT 1213 includes a substrate 11, a gate electrode 12, a gate insulating film 13, a source electrode 14, a drain electrode 15, a semiconductor layer 16, and an insulating film 17. A seal material (liquid crystal) 18 and a transparent electrode 19 are formed in layers over the upper insulating layer 17. The substrate 11 is, for example, a glass substrate, and the gate electrode 12 is formed on the substrate 11. Additionally, over the gate electrode 12, the gate insulating film 13 is formed in contact with the gate electrode 12. Over the gate insulating film 13, the semiconductor layer 16 is formed of, for example, an oxide semiconductor such as In—Ga—Zn—O. Additionally, on both ends of the semiconductor layer 16, the source electrode 14 and the drain electrode 15 are formed. In other words, the semiconductor layer 16 is formed so as to be disposed between the drain electrode 15 and the source electrode 14. The semiconductor layer 16, the source electrode 14, and the drain electrode 15 are formed in contact with the gate insulating film 13. Further, the insulating film 17 (insulating layer) is formed over the semiconductor layer 16, the source electrode 14, and the drain electrode 15. The transparent conductive film 19 is formed over the insulating layer 17 so that the seal material (liquid crystal) 18 is sandwiched therebetween. The transparent conductive film 19 forms the common electrode Tcom (FIG. 1).

The TFT 1214 having such a device structure is formed using a process of photolithography.

Here, the above-described state immediately before the boost operation in which the voltage stress applied to the TFT 1213 becomes the maximum becomes a state in which, for example, a difference voltage of approximately 29V (VGH' (approximately +14V)−VGL (−15V)) is applied between the semiconductor layer 16 and the gate electrode 12. This differential voltage causes an electric field directed from the gate electrode 12 to the source electrode 14 and the drain electrode 15 to be formed. Additionally, the action of the electric field causes electrons to be injected from the semiconductor layer 16 to the gate insulating film 13. If the electrons are accumulated near an interface between the semiconductor layer 16 and the gate electrode 12, the electric field between the gate electrode 12 and the semiconductor layer 16 is weakened, thereby increasing the threshold voltage Vth of the TFT 1213.

Figure 9A:
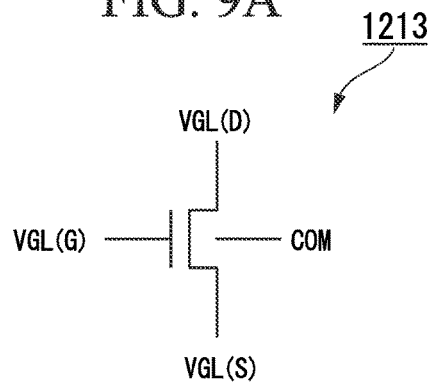
FIG. 9A is a first explanatory diagram illustrating a mechanism of the threshold voltage of the TFT varies (mechanism that the threshold voltage decreases) according to the first embodiment.
Figure 9B:
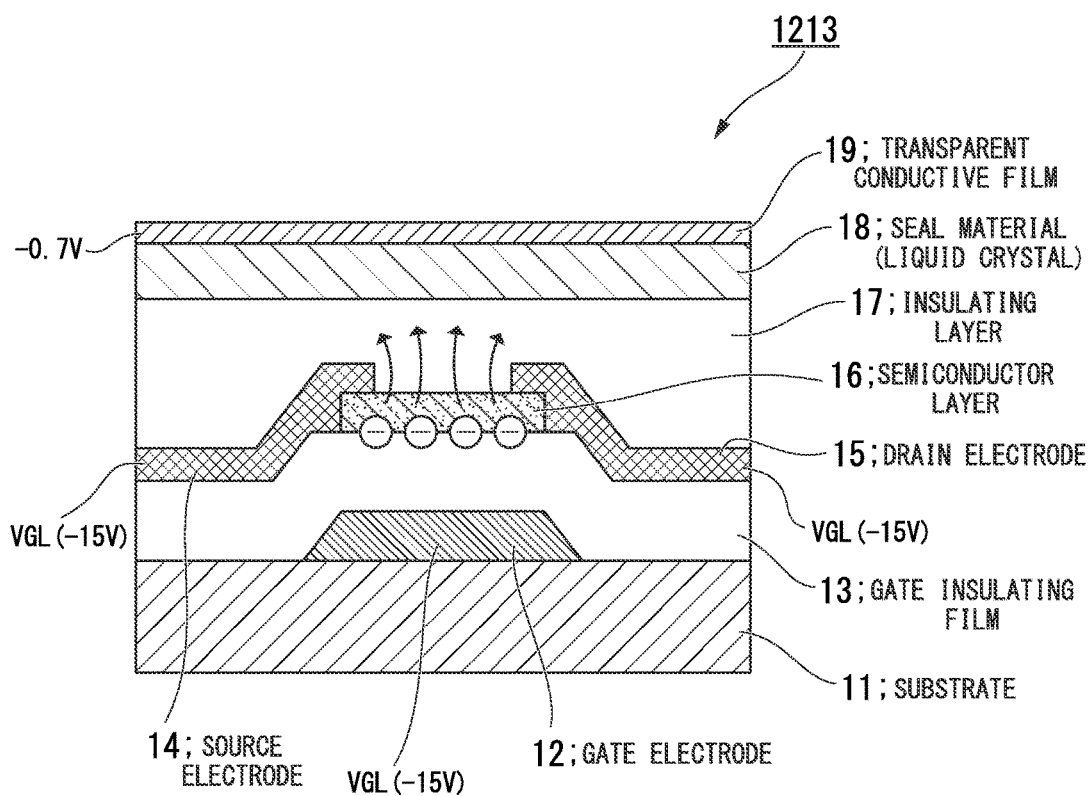
FIG. 9B is a second explanatory diagram illustrating the mechanism of the threshold voltage of the TFT varies (mechanism that the threshold voltage decreases) according to the first embodiment.

FIGS. 9A and 9B are explanatory diagrams illustrating a mechanism in which the threshold voltage Vth of the TFT according to the first embodiment shifts, and illustrating a mechanism in a case where the threshold voltage Vth decreases. Here, FIG. 9A shows an example of a bias state when the threshold voltage Vth of the TFT 1213 decreases. FIG. 9B shows a moving state of electrons when the threshold voltage Vth of the TFT 1213 decreases.

A decrease in threshold voltage Vth of the TFT 1213 is caused in a period in which the gate signal G1, G2, . . . , and Gn become at the low level in the display suspension period T2. In this case, as shown in FIG. 9B, the gate electrode of the TFT 1213 enters a state of being applied with a voltage VGL (e.g., −15V), and the source electrode 14 and the drain electrode 15 enter a state of each being applied with a voltage VGL (e.g., −15V). Therefore, in this case, a voltage of approximately 0V is applied between the semiconductor layer 16 and the gate electrode 12, and an electric field directed from the gate electrode 12 to the source electrode 14 and the drain electrode 15 is not formed.

However, the common terminal Tcom (FIG. 1), which is the transparent conductive film 19 acting as a back gate of the TFT 1213, is biased to, for example, −0.7V, as described above. For this reason, the transparent conductive film 19 becomes higher in potential than the gate electrode 12, and an electric field directed from the transparent conductive film 19 toward the gate electrode 12 is formed. By action of this electric field, electrons injected into the gate insulating film 13 are emitted toward the transparent conductive film 19. As a result, the threshold voltage Vth of the TFT 1213 decreases in the display suspension period T2, and is restored to the initial threshold voltage Vth0 (see the waveform With shown in FIG. 6).

Also in the display period T1, there is a period in which the gate signals G1, G2, . . . , and Gn become at the low-level. For this reason, also in the display period T1, similarly in the display the quiescent period T2, electrons can be released from the gate insulating film 13. However, due to a difference between the electric field strength when electrons are injected in the gate insulating film 13 and the electric field strength when electrons are emitted the gate insulating film 13, the injection of electrons becomes predominant over the emission of electrons. For this reason, there is a tendency that the threshold voltage Vth of the TFT 1213 increases in the display period T1, along with the increased likelihood that the gate signals G1, G2, . . . , and Gn will become at the high level in the display period T1.

Conversely, the display suspension period T2 also includes a period in which the gate signal G becomes at the high level. For this reason, also in display suspension period T2, electrons can be injected into the gate insulating film 13. However, the gate signal G1, G2, . . . , and Gn are less likely to become at the high level in the display suspension period T2, as compared to the display period T1. For this reason, in the display suspension period T2, the emission of electrons become predominant over the injection of electrons, thereby showing a tendency that the threshold voltage Vth of the TFT 1213 decreases.

Thus, in the present embodiment, under the control of the display control circuit 140, in the display suspension period T2, in the period in which the gate signals G1, G2, . . . , and Gn become at the low level, the gate (gate electrode 12), the source (source electrode 14), and the drain (drain electrode 15) of the TFT 1213 constituting the shift register unit circuit 1210 are biased to a voltage equal to or lower than the voltage of the back gate of the TFT 1213, thereby forming an electric field directed from the back gate to the gate electrode 12. By the action of the electric field, the electrons injected into the gate insulating film 13 are released.

Thus, according to the present embodiment, even if the threshold voltage Vth of the TFT 1213 increases in the display period T1, it is possible to decrease and restore the threshold voltage Vth in the display suspension period T2. Therefore, it is possible to stabilize the display operation, thus realizing a display device with high reliability. Additionally, according to the present embodiment, there becomes no need to use a larger TFT in anticipation of degradation of the electrical characteristics of the peripheral circuit TFT. For this reason, it is possible to reduce the size of the peripheral circuit TFT. Therefore, it is possible to realize a narrow frame and low power consumption of the display device.

Further, according to the present embodiment, it is sufficient for the timing control circuit 141 to control only the respective clock cycles (pulse intervals) of the clock signals GCK1 and GCK2, so that the clock frequency in the display suspension period T2 becomes smaller than the clock frequency in the display period T1. For this reason, it is possible to, by simple timing control, relieve the voltage stress applied to the TFT 1213 and suppress the shift of the threshold voltage Vth thereof.

Moreover, if, for example, an N-channel-type thin film transistor using an oxide semiconductor such as In—Ga—Zn—O is employed as the TFTs 121, 1212, 1213, and 1214 constituting the shift register unit circuit 1210, it is possible to realize a reduction in off-leakage current and a high driving force.

Figure 10:
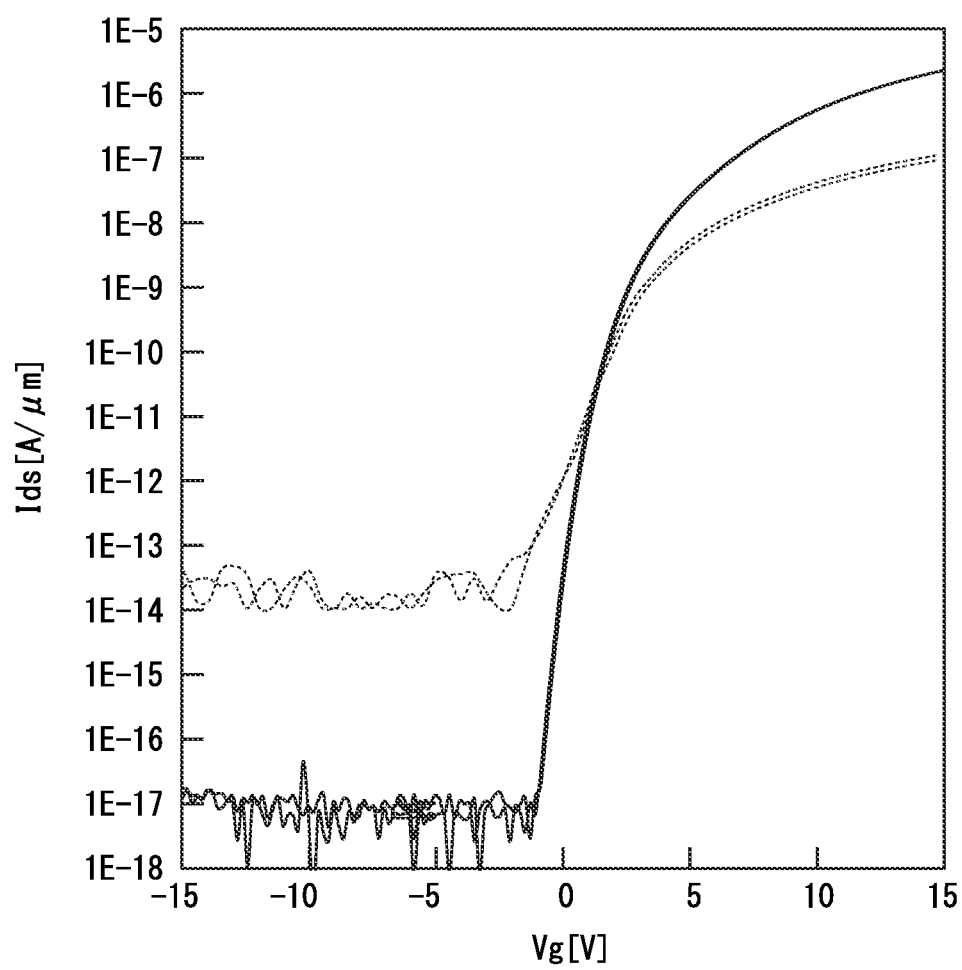
FIG. 10 is a characteristic diagram showing an example of characteristics of transistors constituting the shift register circuit according to the first embodiment.

Here, FIG. 10 is a characteristic diagram showing an example of characteristics of the TFTs constituting the shift register circuit 121 according to the first embodiment, and is a diagram showing an example of characteristics of an N-channel-type thin film transistor using an oxide semiconductor such as In—Ga—Zn—O. In this figure, a solid line represents the characteristics of the N-channel-type thin film transistor using an oxide semiconductor such as In—Ga—Zn—O, and a dotted line represents the characteristics of the conventional amorphous silicon TFT. As can be understood from FIG. 10, the N-channel-type thin film transistor using the oxide semiconductor is employed, thereby making it possible to reduce the off-leakage current by three digits or more order of magnitude, and improving the driving force (drain current) of the TFTs 1211 to 1214 approximately 20 times, as compared to the characteristics of the conventional amorphous silicon TFT. Additionally, such high driving force makes it possible to reduce the size of the TFTs 1211 to 1214 to, for example, one-twentieth, as compared to the case of using amorphous silicon TFT, thereby enabling a narrower frame.

Further, it is also possible to improve the driving frequency characteristics by employing the N-channel-type thin film transistor using an oxide semiconductor. In other words, in a case where an amorphous silicon TFT is used, the lower limit of the driving frequency in the display suspension period T2 is, for example, 45 Hz. On the other hand, according to the N-channel-type thin film transistor using the oxide semiconductor, the driving frequency can be improved up to, for instance, approximately 0.2 Hz. Thus, it is possible to reduce the power consumption in the display suspension period T2 to, for example, less than approximately 1/100, as compared to the case of using an amorphous silicon TFT.

Here, the description has been given in the above-described first embodiment that in the case where the threshold voltage Vth of the TFT 1213 is decreased in the display suspension period T2, as illustrated in FIGS. 8A and 8B, the gate electrode 12, the source electrode 14, and the drain electrode 15 are biased to the voltage VGL (e.g., −15V), and the voltages of the respective electrodes are biased to a voltage equal to or lower than the voltage of the transparent conductive film 19 to be the common terminal Tcom that acts as the back gate. The first embodiment is not limited to this example. As long as the increased threshold voltage Vth of the TFT can be restored, respective electrodes of the gate electrode 12, the source electrode 14, and the drain electrode 15 may be biased to mutually different voltages.

Additionally, the description has been given in the above-described first embodiment that the electrons injected into the gate insulating film 13 are discharged from the gate insulation film 13 in the display suspension period T2. However, electrons to be discharged from the gate insulation film 13 are not necessarily limited to the electrons injected into the gate insulating film 13, and any electrons involved in the increase in the threshold voltage Vth of the TFT may be subject to the discharge.

[Second Embodiment]

Next, a second embodiment of the present invention will be described with reference to FIG. 11.

In the second embodiment, the configurations shown in FIGS. 1 to 4 used in the first embodiment are diverted.

In the above-described first embodiment, the clock frequency in the display suspension period T2 is made smaller than the clock frequency in the display period T1. Meanwhile, in the second embodiment, the display control circuit 140 decreases the clock frequency in part of the display suspension period T2, similarly to the first embodiment, and controls the bias state of the TFT 1213 so that an absolute value of the threshold voltage Vth of the TFT 1213 (output transistor) is decreased. Additionally, in the present embodiment, the display control circuit 140 controls the power supply of the display unit 110 to the off-state in the remaining period of the display suspension period T2.

Other configurations and operations are similar to those of the above-described first embodiment.

Here, the second embodiment is applicable not only to the first embodiment, but also to a third embodiment to a twelfth embodiment which will be described later.

Figure 11:
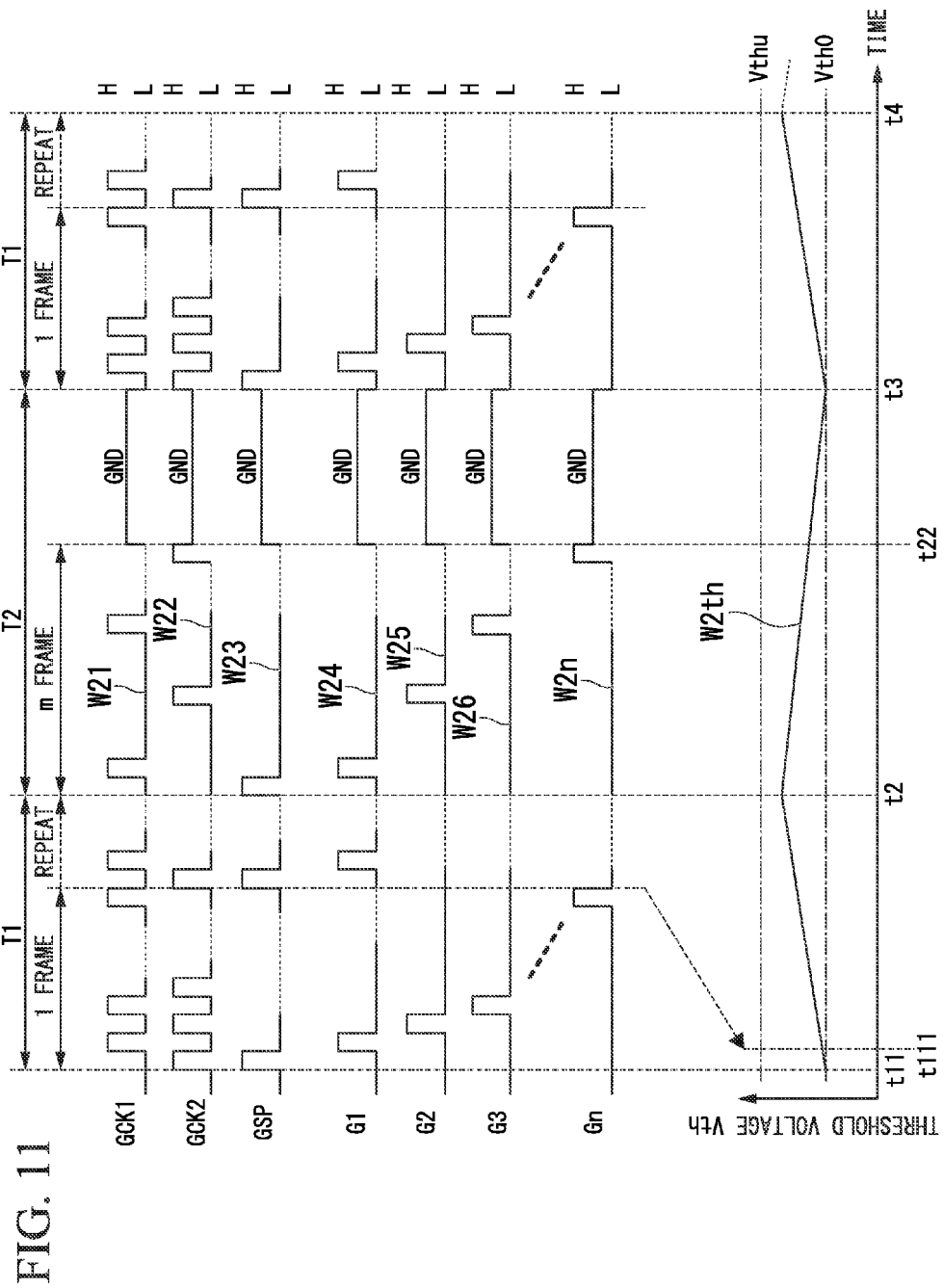
FIG. 11 is a time chart showing an example of operation of a shift register circuit according to a second embodiment.

FIG. 11 is a time chart showing an example of operation of the shift register circuit 121 according to the second embodiment. In the figure, waveforms W21, W22, and W23 respectively represent a voltage waveform of the clock signal GCK1, a voltage waveform of the clock signal GCK2, and a voltage waveform of the gate start pulse signal GSP. Additionally, waveforms W24, W25, W26, . . . , and W2n respectively represent voltage waveforms of the gate signals G1, G2, G3, . . . , and Gn. Further, a waveform W2th represents a waveform of a threshold voltage Vth of the TFT 1213 of the shift register unit circuit 1210 shown in FIG. 3.

In the example of FIG. 11, in a period from time t2 to time t22 which is included in the display suspension period T2 and corresponds to the m frame (m: natural number), the bias state of the TFT 1213 is controlled similarly to the first embodiment, so that the gate signals G1, G2, . . . , and Gn having low frequencies are generated, and an absolute value of the threshold voltage Vth of the TFT 1213 (output transistor) is decreased. In this example, the threshold voltage Vth of the TFT 1213 is restored to the initial threshold voltage Vth0 at time t22 that is before time t3 at which the display suspension period T2 ends. If the threshold voltage Vth of the TFT 1213 is restored (i.e., if all the electrons injected into the oxide film 13 are discharged), the threshold voltage Vth of TFT 1213 becomes constant and does not change (see the reference waveform W2th from time t22 to time t3 shown in FIG. 11). For this reason, there becomes no need to maintain the gate of the TFT 1213 at the low level after the threshold voltage Vth is restored. Thus, even if the low level voltage (e.g., −15V) is continuously applied to the gate of the TFT 1213, the power required therefor will be wastefully consumed.

For this reason, in the present embodiment, the display control circuit 140 controls, for example, the power supply of the signal line driver circuit 130 including the booster circuits 131 and 132 and the scan driver circuit 120 of the display device 100 to the off-state, thereby terminate the operations thereof, in a period from time t22 to time t3 at which the next display period begins. Thereby, respective signal levels of the clock signals GCK1 and GCK2, the gate start pulse signal GSP, and the gate signals G1, G2, G3, . . . , and Gn, are set to the ground level GND (see the waveforms W21, W22, W23, W24, W25, W26, . . . , and W2n from time t22 to time t3 shown in FIG. 11).

According to the present embodiment, in the period from time t22 to time t3 that is after the threshold voltage Vth of the TFT 1213 is restored, the power supply of the signal line driver circuit 130 including the booster circuits 131 and 132 and the scanning line driver circuit 120 are controlled to be the off-state, and thus the power to be consumed by these circuits is not generated. Therefore, it becomes possible to further suppress the power consumption in the display suspension period T2, as compared to the above-described first embodiment. Additionally, the respective signal levels of the clock signals GCK1 and GCK2, the gate start pulse signal GSP, and the gate signals G1, G2, G3, . . . , and Gn become at the ground level GND. For this reason, the gate electrode, the source electrode, and the drain electrode of the TFT 1213 also become at the ground level GND. For this reason, the voltage stress is not applied to the TFT 1213, and a variation in threshold voltage Vth does not occur.

[Third Embodiment]

Next, a third embodiment of the present invention will be described with reference to FIG. 12.

Also in the third embodiment, the configurations shown in FIGS. 1 to 4 used in the first embodiment are diverted.

In the present embodiment, similarly to the first embodiment, in the display suspension period T2, the display control circuit 140 supplies to the scanning line driver circuit 120, a signal with a frequency lower than the frequency of the signal supplied to the scanning line driver circuit 120 in the display period T1. In addition, in the display suspension period T2, the display control circuit 140 supplies to the scanning line driver circuit 120, a signal with a voltage amplitude smaller than the voltage amplitude of the signal supplied to the scanning line driver circuit 120 in the display period T1.

Other configurations and operations are similar to those of the first embodiment. Here, the third embodiment is applicable not only to the first embodiment, but also to the second embodiment.

Specifically, assuming that Vck1 represents voltage amplitudes of the respective gate signals G1, G2, G3, . . . , and Gn in the display period T1, and Vck2 represents voltage amplitudes of the respective signals in the display suspension period T2, the display control circuit 140 controls the high level of each signal in the display suspension period T2 so as to satisfy Vck1≥Vck2. Thus, in the present embodiment, in the display suspension period T2, the respective voltage amplitudes of the gate signals G1, G2, . . . , and Gn are set to a voltage amplitude equal to or smaller than the voltage amplitude of the first embodiment.

Other configurations and operations are similar to those of the first embodiment.

Figure 12:
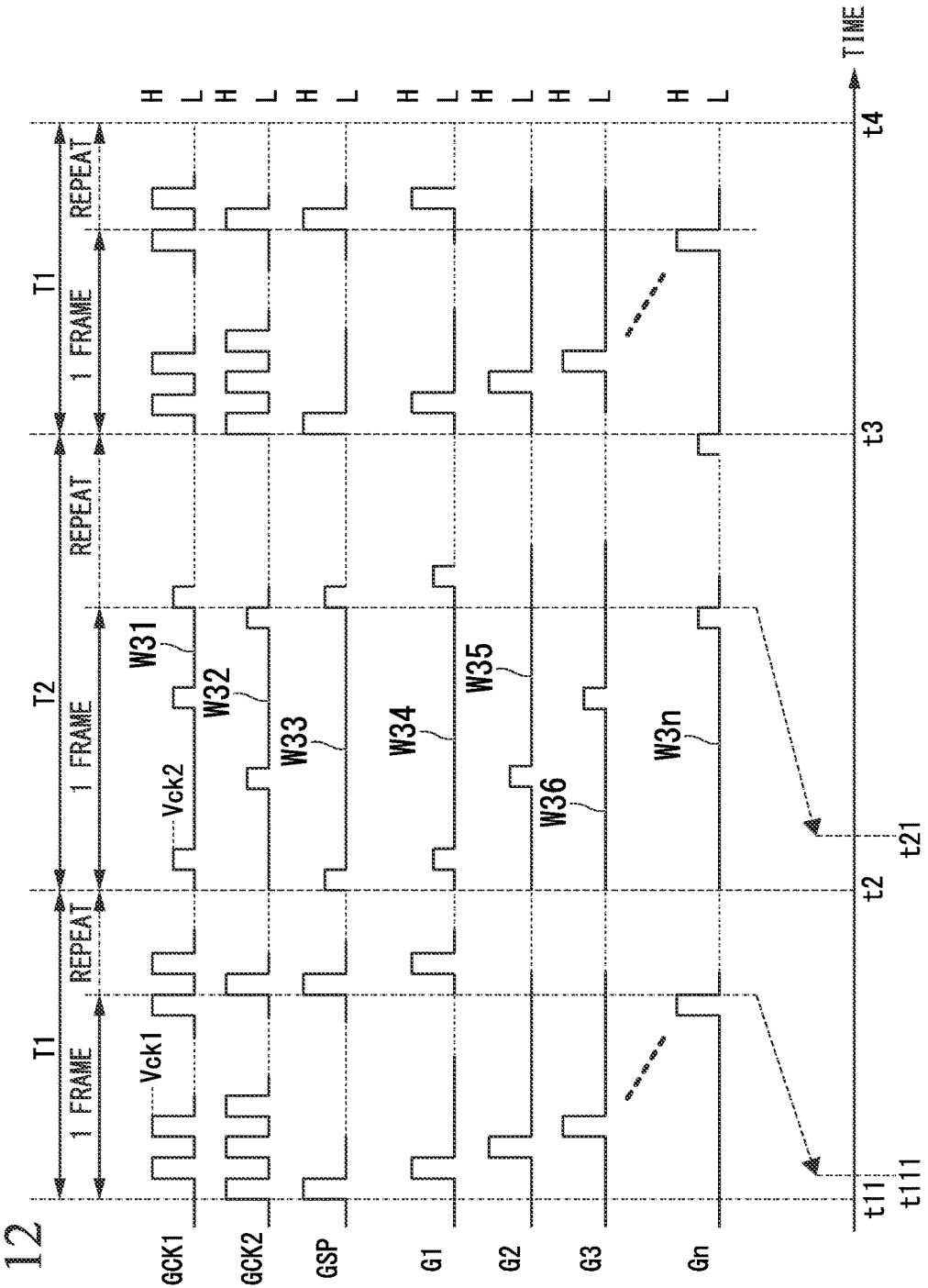
FIG. 12 is a time chart showing an example of operation of a shift register unit circuit according to a third embodiment.

FIG. 12 is a time chart showing an example of operation of the shift register circuit 121 according to the third embodiment. In the figure, waveforms W31, W32, and W33 respectively represent a voltage waveform of the clock signal GCK1, a voltage waveform of the clock signal GCK2, and a voltage waveform of the gate start pulse signal GSP. Additionally, waveforms W34, W35, W36, . . . , and W3n respectively represent voltage waveforms of the gate signals G1, G2, G3, . . . , and Gn.

According to the present embodiment, as compared to the first embodiment, the voltage stress applied between the gate electrode and the source/drain electrode of the TFT 1213 decreases in the display suspension period T2. Thereby, in the display suspension period T2, injection of electrons into the gate insulating film 13 is further suppressed in the period in which the gate signals G1, G2, G3, . . . , and Gn become at the high level. Therefore, as compared to the first embodiment, it is possible to further promote restoration of the threshold voltage Vth of the TFT 1213, thus further achieving lower power consumption and higher reliability.

[Fourth Embodiment]

Next, a fourth embodiment of the present invention will be described with reference to FIG. 13.

Also in the fourth embodiment, the configurations shown in FIGS. 1 to 4 used in the first embodiment are diverted.

In the above-described first embodiment, the clock frequency in the display suspension period T2 is made smaller than the clock frequency in the display period T1. Meanwhile, in the fourth embodiment, the display control circuit 140 makes a clock frequency in the display suspension period T2 the same as a clock frequency to be supplied to the scanning line driver circuit 120 in the display period T1, and "intermittently" supplies the clock signal to the scanning line driver circuit 120 in the display suspension period T2. Specifically, in the present embodiment, for example, the display control circuit 140 thins frames in the display suspension period T2 to set a frame frequency (frame rate) f2 in the display suspension period T2 to be lower than a frame frequency f1 in the display period T1, thereby realizing the intermittent operation.

Other configurations and operations are similar to those of the first embodiment.

Figure 13:
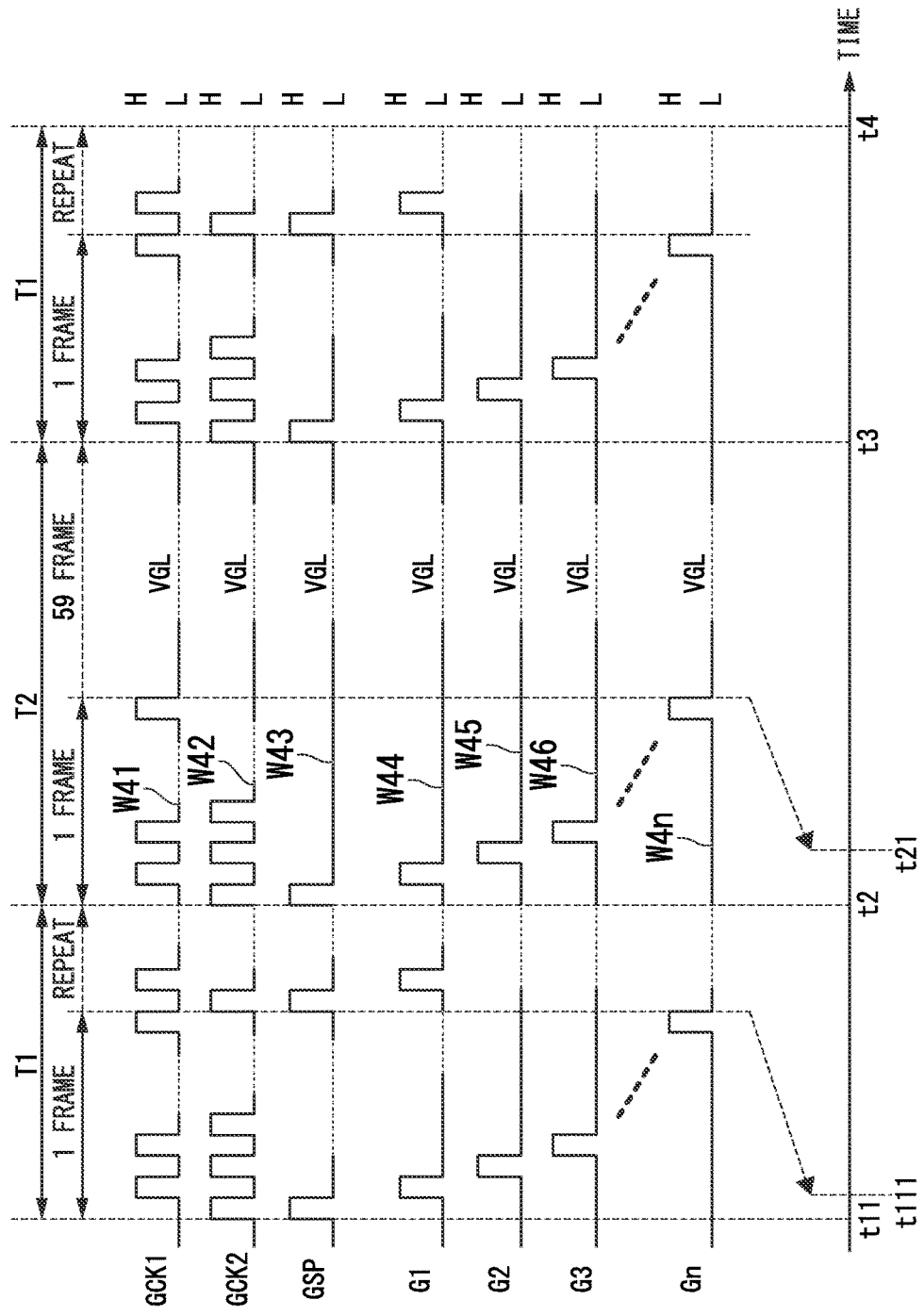
FIG. 13 is a time chart showing an example of operation of a shift register circuit according to a fourth embodiment.

FIG. 13 is a time chart showing an example of operation of the shift register circuit 121 according to the fourth embodiment. In the figure, waveforms W41, W42, and W43 respectively represent a voltage waveform of the clock signal GCK1, a voltage waveform of the clock signal GCK2, and a voltage waveform of the gate start pulse signal GSP. Additionally, waveforms W44, W45, W46, . . . , and W4n respectively represent voltage waveforms of the gate signals G1, G2, G3, . . . , and Gn.

If it is assumed in FIG. 13 that the clock frequencies of the clock signals GCK1 and GCK2 in the display period T1 are, for example, 60 Hz, a frame frequency substantially the same as that in the display period T1 is set only to the first frame in the display suspension period T2. Additionally, for the remaining 59 frames, respective signal levels of the clock signals GCK1 and GCK2, the gate start pulse signal GSP, and the gate signals G1, G2, G3, . . . , and Gn are fixed to the low level (voltage VGL), and the driving of the TFT 1213 is suspended. Thus, the frame frequency f2 in the display suspension period T2 is decreased to be smaller than the frame frequency f1 in the display period T1, and operation for restoring the threshold voltage Vth is intermittently performed.

Here, as long as the frame frequency f2 in the display suspension period T2 can be decreased to be smaller than the frame frequency f1 in the display period T1, any multiple frames in the display suspension period T2 may be set to be substantially the same as those in the display period T1.

According to the present embodiment, the frame frequency f2 in the display suspension period T2 is decreased, thereby making it possible to shorten the period in which the voltage stress is applied to the TFT 1213 in the display suspension period T2. Additionally, the frame frequency f2 in the display suspension period T2 is decreased, thereby making it possible to relatively extend the period for restoring the threshold voltage Vth of the TFT 1213. Therefore, also in the present embodiment, similar to the first embodiment, it is possible to suppress the shift of the threshold voltage Vth of the TFT 1213 and to realize a display device with excellent reliability.

Here, it is assumed in the present embodiment that only the first one frame in the display suspension period T2 is set with substantially the same frame frequency as that in the display period T1. However, the number and position of frames to be set with substantially the same frame frequency in the display suspension period T2 as that in the display period T1 are optional.

[Fifth Embodiment]

Next, a fifth embodiment of the present invention will be described with reference to FIG. 14.

Also in the fifth embodiment, the configurations shown in FIGS. 1 to 4 used in the first embodiment are diverted.

In the present embodiment, similar to the fourth embodiment, the display control circuit 140 makes a clock frequency in the display suspension period T2 the same as a clock frequency to be supplied to the scanning line driver circuit 120 in the display period T1, and sets the frame frequency f2 in the display suspension period T2 to be lower than the frame frequency f1 in the display period T1, and thereby intermittently supplies a clock signal to the scanning line driver circuit 120 in the display suspension period T2. In addition, the display control circuit 140 supplies to the scanning line driver circuit 120 in the display suspension period T2, a signal with a voltage amplitude smaller than the voltage amplitude of the signal to be supplied to the scanning line driver circuit 120 in the display period T1.

Other configurations and operations are similar to those of the fourth embodiment.

Figure 14:
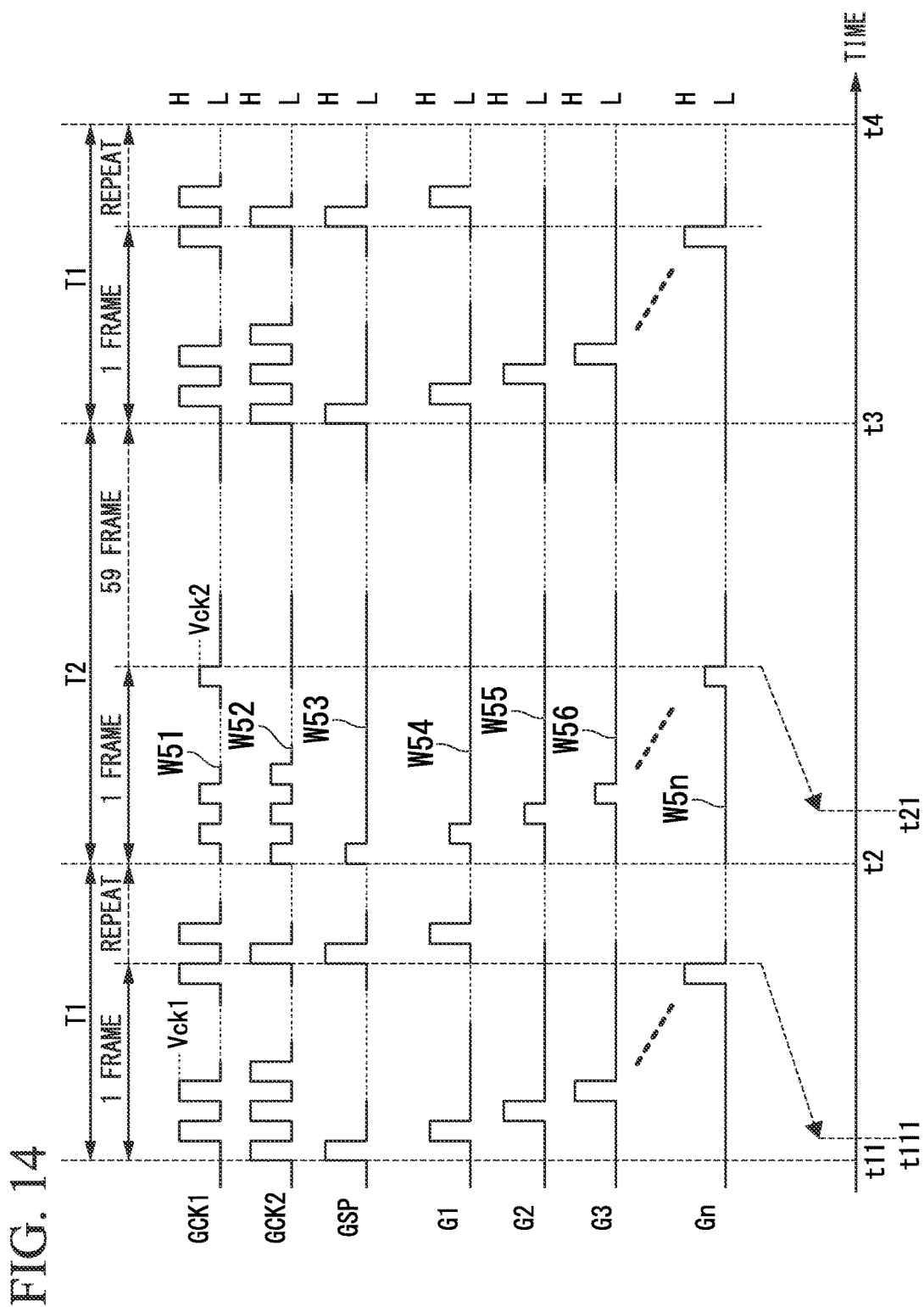
FIG. 14 is a time chart showing an example of operation of a shift register circuit according to a fifth embodiment.

FIG. 14 is a time chart showing an example of operation of the shift register circuit 121 according to the fifth embodiment. In FIG. 14, waveforms W51, W52, and W53 respectively represent a voltage waveform of the clock signal GCK1, a voltage waveform of the clock signal GCK2, and a voltage waveform of the gate start pulse signal GSP. Additionally, waveforms W54, W55, W56, . . . , and W5n respectively represent voltage waveforms of the gate signals G1, G2, G3, . . . , and Gn.

The display control circuit 140 sets, in the display suspension period T2, high levels of the respective signals of the clock signals GCK1 and GCK2, the gate start pulse signal GSP, and the gate signals G1, G2, G3, . . . , and Gn to a voltage lower than the voltage VGH. In other words, assuming that Vck1 represents voltage amplitudes of the gate signals G1, G2, G3, . . . , and Gn in the display period T1, and Vck2 represents voltage amplitudes of the gate signals G1, G2, . . . , and Gn in the display suspension period T2, the display control circuit 140 controls the boosted voltage of the booster circuits 131 and 132 so as to satisfy a relationship Vck1≥Vck2, thereby controlling the signal levels of the respective signals.

According to the present embodiment, as compared to the fourth embodiment, the signal level (voltage amplitude) of each signal decreases in the display suspension period T2. Therefore, as compared to the fourth embodiment, it is possible to relieve much more voltage stress applied to the TFT 1213 and to improve the reliability.

[Sixth Embodiment]

Next, a sixth embodiment of the present invention will be described with reference to FIG. 15.

Also in the sixth embodiment, the configurations shown in FIGS. 1 to 4 used in the first embodiment are diverted.

It has been described in the above-described first to fifth embodiments that also in the display suspension period T2, the respective signal levels of the clock signals GCK1 and GCK2, the gate start pulse signal GSP, and the gate signal G1, G2, G3, . . . , and Gn are caused to transition between the high level and the low level. Meanwhile, in the sixth embodiment, the display control circuit 120 fixes a signal to be supplied to the scanning line driver circuit 120 in the display suspension period T2, to a predetermined level to relieve the voltage stress applied to the output transistor of the scanning line driver circuit 120.

Specifically, in the present embodiment, the display control circuit 140 fixes a signal to be supplied to the scanning line driver circuit 120 in the display suspension period T2, to the low level (predetermined level). In other words, the display control circuit 140 fixes the respective signal levels of the clock signals GCK1 and GCK2, the gate start pulse signal GSP, and the gate signals G1, G2, G3, . . . , and Gn, to the voltage VGL (e.g., −15V) indicating the low level.

Other configurations and operations are similar to those of the first embodiment.

Figure 15:
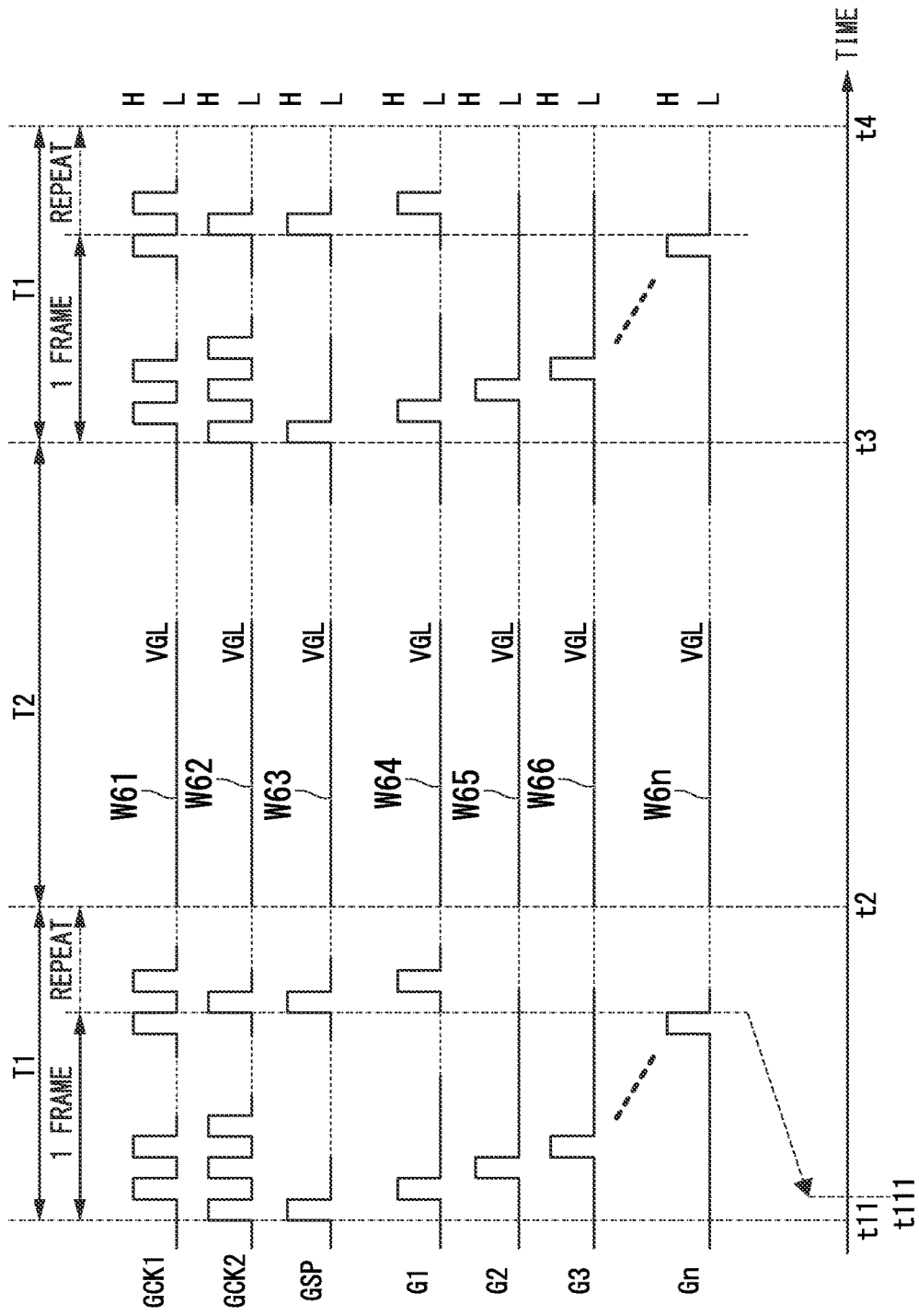
FIG. 15 is a time chart showing an example of operation of a shift register circuit according to a sixth embodiment.

FIG. 15 is a time chart showing an example of operation of the shift register circuit 121 according to the sixth embodiment. In FIG. 15, waveforms W61, W62, and W63 respectively represent a voltage waveform of the clock signal GCK1, a voltage waveform of the clock signal GCK2, and a voltage waveform of the gate start pulse signal GSP. Waveforms W64, W65, W66, . . . , and W6n respectively represent voltage waveforms of the gate signals G1, G2, G3, . . . , and Gn.

As indicated by the waveforms W61, W62, . . . , and W6n in the display suspension period T2 shown in FIG. 15, the display control circuit 140 causes the clock signals GCK1 and GCK2 and the gate start pulse signal GSP not to be generated, and fix these signal levels to the voltage VGL indicating the low level. Thus, in the display suspension period T2, the respective signal levels of the gate signal G1, G2, G3, . . . , and Gn are also fixed to the voltage VGL indicating the low level.

According to the present embodiment, the respective signal levels of the gate signals G1, G2, G3, . . . , and Gn are fixed to the low level. For this reason, in the display suspension period T2, it is possible to eliminate the period in which voltage stress which causes an increase in threshold voltage Vth of the TFT 1213 occurs. Therefore, as compared to the above-described first to fifth embodiments, it is possible to more quickly restore the threshold voltage Vth of the TFT 1213 in the display suspension period T2, and to realize a display device with excellent reliability. Additionally, according to the present embodiment, the respective signal levels of the gate signals G1, G2, G3, . . . , and Gn are fixed to the low level, and the scanning of the pixel unit PIX is not performed, thereby making it also possible to reduce power consumption required for the

[Seventh Embodiment]

Next, a seventh embodiment of the present invention will be described with reference to FIG. 16.

Also in the seventh embodiment, the configurations shown in FIGS. 1 to 4 used in the first embodiment are diverted.

In the seventh embodiment, similar to the sixth embodiment, the display control circuit 140 fixes a signal to be supplied to the scanning line driver circuit 120 in the display suspension period T2, to a predetermined level to relieve voltage stress applied to the TFT 1213 (output transistor). As the predetermined level, however, the display control circuit 140 fixes the signal to a signal level corresponding to a voltage amplitude having an absolute value smaller than an absolute value of a voltage amplitude corresponding to the signal level to be supplied to the scanning line driver circuit 120 in the display period T1.

Specifically, in the present embodiment, the display control circuit 140 fixes a voltage of the signal to be supplied to the scanning line driver circuit 120, to a low level corresponding to the voltage amplitude having an absolute value smaller than the absolute value of the low level (e.g., −15V) of the clock signals GCK1 and GCK2 to be supplied to the scanning line driver circuit 120 in the display period T1. In other words, the display control circuit 140 sets voltages of the respective signal levels of the gate signals G1, G2, G3, . . . , and Gn in the display suspension period T2, to a voltage VGLoff having an absolute value smaller than the absolute value of the voltage VGL. Here, the signs of the voltage VGL and the voltage VGLoff are both negative.

Other configurations and operations are similar to those of the sixth embodiment.

Figure 16:
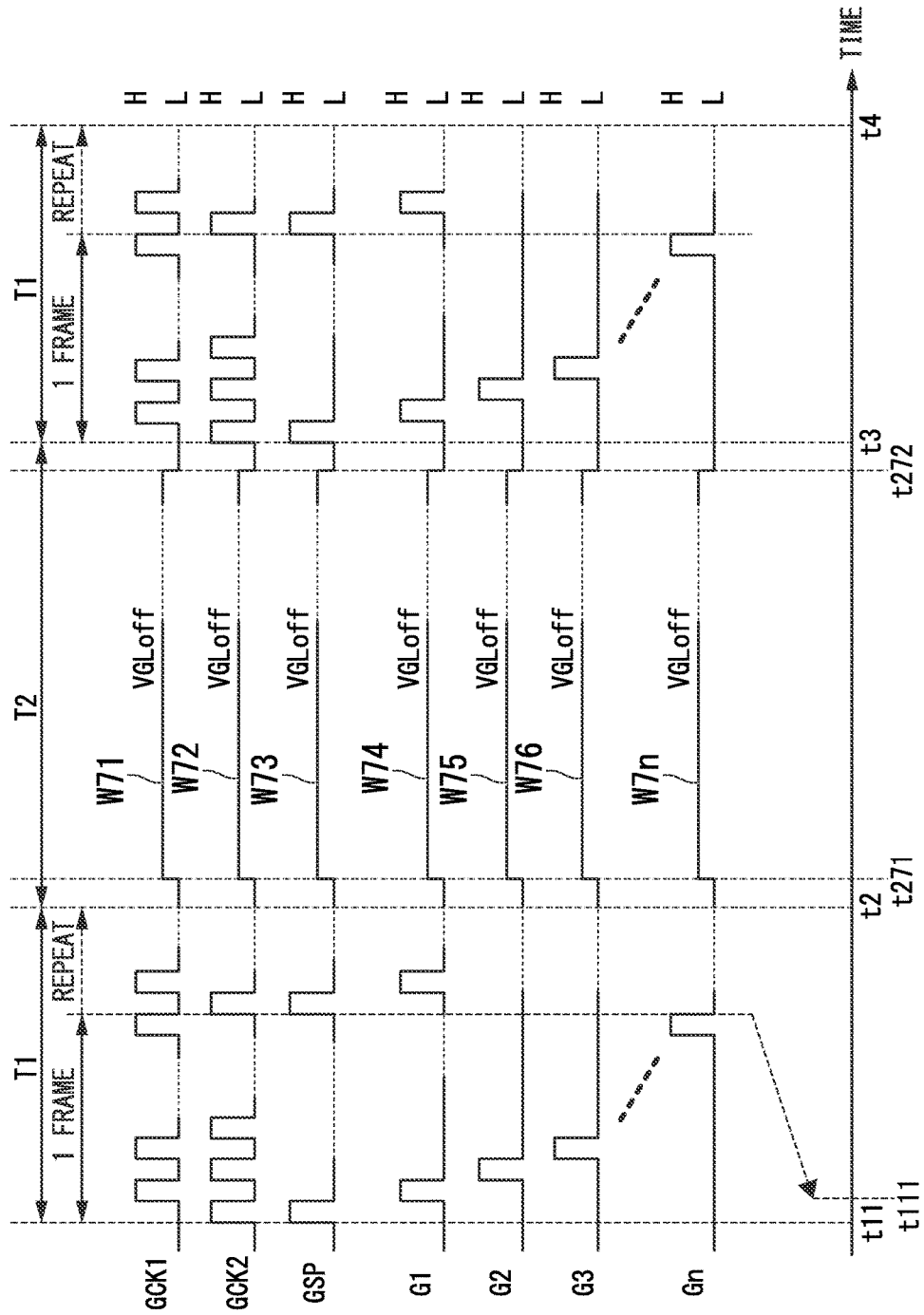
FIG. 16 is a time chart showing an example of operation of a shift register circuit according to an seventh embodiment.

FIG. 16 is a time chart showing an example of operation of the shift register circuit 121 according to the seventh embodiment. In FIG. 16, waveforms W71, W72, and W73 respectively represent a voltage waveform of the clock signal GCK1, a voltage waveform of the clock signal GCK2, and a voltage waveform of the gate start pulse signal GSP. Additionally, waveforms W74, W75, W76, . . . , and W7n respectively represent voltage waveforms of the gate signals G1, G2, G3, . . . , and Gn. Also, in this figure, a horizontal axis represents time, and a vertical axis represents a signal level (voltage) of each waveform.

As indicated by the voltage waveforms W71, W72, W73, . . . , and W7n in the display suspension period T2 shown in FIG. 16, the display control circuit 140 causes the clock signals GCK1 and GCK2 and the gate start pulse signal GSP not to be generated, and fix, from time t271 to time 272 in the display suspension period T2, these signal levels to a low level indicated by a voltage VGLoff smaller in absolute value than the voltage VGL. Such control can be realized by, for example, the display control circuit 140 controlling the boosting operation of the booster circuit 132 so as to satisfy a relationship |VGL|≥|VGLoff|.

According to the present embodiment, as compared to the sixth embodiment, the boosted voltage of the booster circuit 132 in the display suspension period T2 is decreased, thereby making it possible to reduce the power consumption required for the boosting operation. Additionally, according to the present embodiment, similar to the sixth embodiment, it is possible to eliminate, in the display suspension period T2, a period in which voltage stress which causes an increase in threshold voltage Vth of the TFT 1213 occurs. Therefore, as compared to the first to fifth embodiments, it is possible to much more quickly restore the threshold voltage Vth of the TFT 1213 and to reduce the power consumption.

[Eighth Embodiment]

Next, an eighth embodiment of the present invention will be described with reference to FIG. 17.

In the eighth embodiment, the configurations shown in FIGS. 1 to 4 used in the first embodiment are diverted.

It has been described in the above-described first to seventh embodiments that the voltage, in the display suspension period T2, of the common electrode Tcom of the respective pixel units PIX of the display unit 110 is set to a general common electrode voltage Vcom (e.g., −0.7V) in the display period T1. Meanwhile, in the eighth embodiment, the display control circuit 140 fixes to a predetermined level, the voltage of the common electrode Tcom of the pixel units PIX that act as the back gate of the TFT 1213 (output transistor) in the display suspension period T2.

Specifically, in the present embodiment, the display control circuit 140 sets the common electrode voltage Vcom in the display suspension period T2 to, as the predetermined level, a voltage VGL (e.g., −15V) similar to the low levels of the gate signals G1, G2, G3, . . . , and Gn. Such control can be realized by, for example, supplying to the common electrode Tcom of the respective pixels PIX, under the control of the display control circuit 140, a voltage VGL boosted in the negative direction by the boost circuit 132, in place of the normal common electrode voltage Vcom.

Other configurations and operations are similar to those of the first embodiment.

Figure 17:
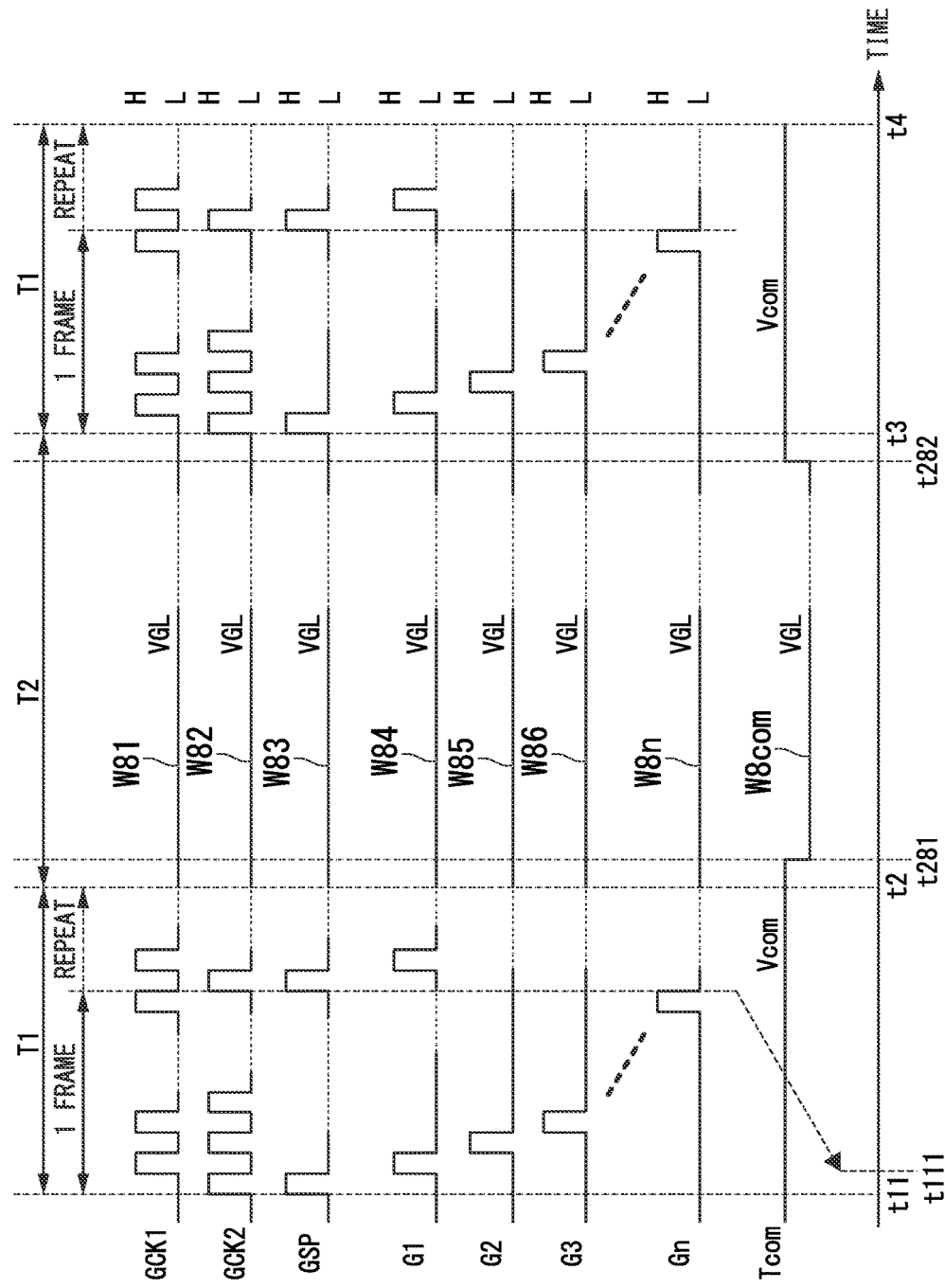
FIG. 17 is a time chart showing an example of operation of a shift register circuit according to an eighth embodiment.

FIG. 17 is a time chart showing an example of operation of the shift register circuit 121 according to the eighth embodiment. In the figure, waveforms W81, W82, and W83 respectively represent a voltage waveform of the clock signal GCK1, a voltage waveform of the clock signal GCK2, and a voltage waveform of the gate start pulse signal GSP. Additionally, waveforms W84, W85, W86, . . . , and W8n respectively represent voltage waveforms of the gate signals G1, G2, G3, . . . , and Gn. Further, W8com represents a voltage waveform to be applied to the common electrode Tcom.

As can be understood from FIG. 17, in the present embodiment, the display control circuit 140 fixes a voltage of the common electrode Tcom of the pixel units PIX to the low level in the display suspension period T2. More specifically, as shown by the voltage waveforms W81, W82, and W83 in the display suspension period T2 shown in the same figure, the display control circuit 140 causes the clock signals GCK1 and GCK2 and the gate start pulse signal GSP not to be generated, and fixes these signal levels to the low level of the voltage VGL. Thereby, the respective signal levels of the gate signals G1, G2, G3, . . . , and Gn are fixed to the voltage VGL (e.g., −15V) in the display suspension period T2. In addition, as indicated by the waveform W8com in the display suspension period T2, the display control circuit 140 sets, from time t281 to time t282 in the display suspension period T2, the voltage of the common electrode Tcom of the respective pixel units PIX to the voltage VGL (e.g., −15V).

According to the present embodiment, in the display suspension period T2, there becomes no need to generate the common electrode voltage Vcom (e.g., −0.7V) separately from the voltage VGL, thereby making it possible to reduce power consumption. In addition, according to the present embodiment, similar to the above-described seventh embodiment, it is possible to eliminate in the display suspension period T2, a period in which voltage stress which causes an increase in threshold voltage Vth of the TFT 1213 occurs. Therefore, as compared to the above-described first to fifth embodiments, it is possible to much more quickly restore the threshold voltage Vth of the TFT 1213, and to reduce the power consumption required for scanning.

[Ninth Embodiment]

Next, a ninth embodiment of the present invention will be described with reference to FIG. 18.

Also in the ninth embodiment, the configurations shown in FIGS. 1 to 4 used in the first embodiment are diverted.

It has been described in the above-described eighth embodiment that the voltage VGL (e.g., −15V) similar to the low levels of the gate signals G1, G2, G3, . . . , and Gn is set as the predetermined level of the voltage of the common electrode Tcom. Meanwhile, in the ninth embodiment, the display control circuit 140 sets, as the predetermined level of the voltage of the common electrode Tcom, a voltage VGH (e.g., +15V) similar to the high levels of the gate signals G1, G2, G3, . . . , and Gn. Such control can be realized by, for example, under the control of the display control circuit 140, supplying to the common electrode Tcom of the respective pixels PIX, a voltage VGH boosted by the booster circuit 131, in place of the general common electrode voltage Vcom.

Other configurations and operations are similar to those of the eighth embodiment.

Figure 18:
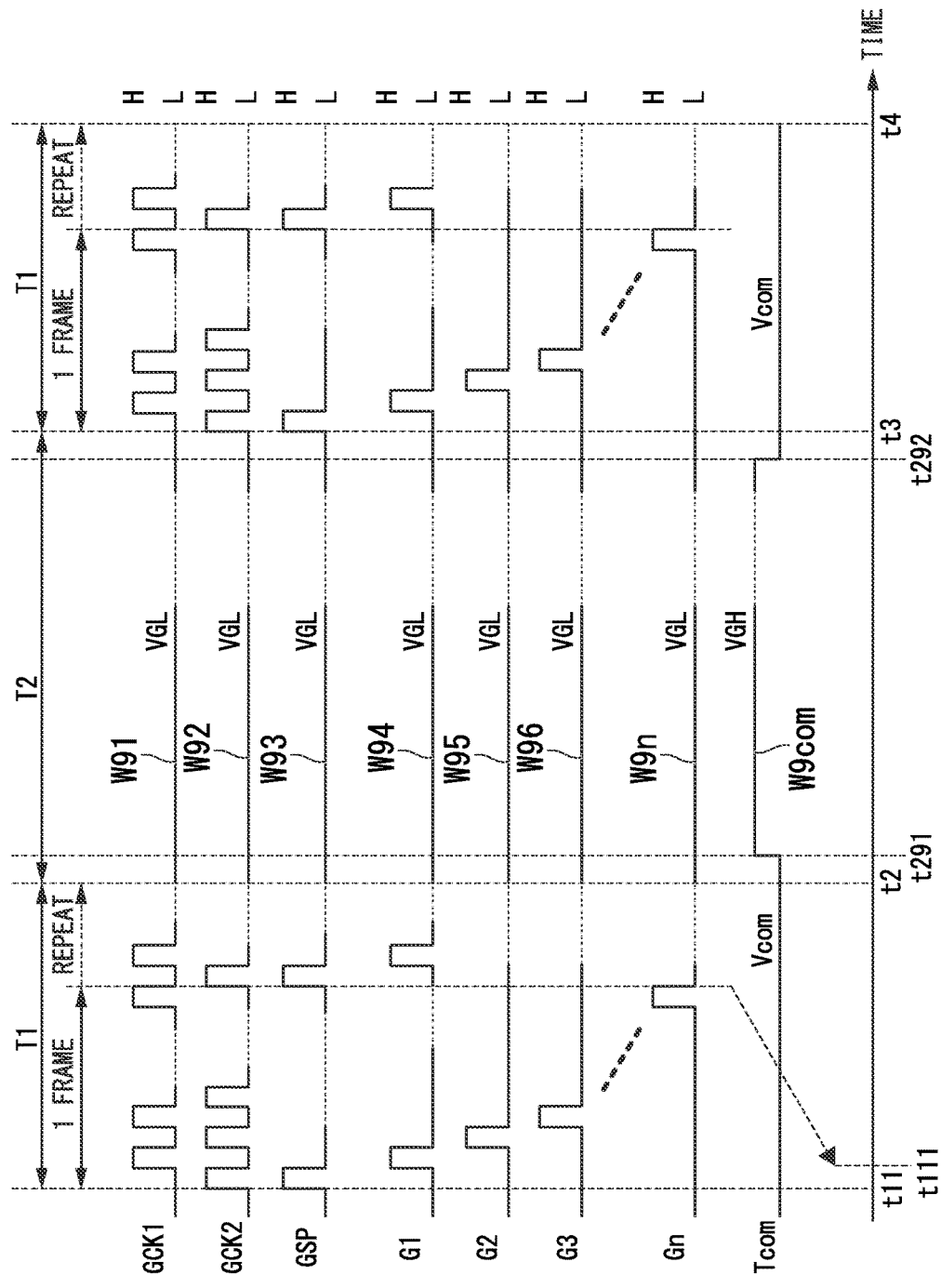
FIG. 18 is a time chart showing an example of operation of a shift register circuit according to a ninth embodiment.

FIG. 18 is a time chart showing an example of operation of the shift register circuit 121 according to the ninth embodiment. In the figure, waveforms W91, W92, and W93 respectively represent a voltage waveform of the clock signal GCK1, a voltage waveform of the clock signal GCK2, and a voltage waveform of the gate start pulse signal GSP. Additionally, waveforms W94, W95, W96, . . . , and W9n respectively represent voltage waveforms of the gate signals G1, G2, G3, . . . , and Gn. Further, W9com represents a voltage waveform applied to the common electrode Tcom.

As shown by the waveforms W91, W92, and W93 in the display suspension period T2 shown in FIG. 18, the display control circuit 140 causes the clock signals GCK1 and GCK2 and the gate start pulse signal GSP not to be generated, and fixes these signal levels to the voltage VGL. Thereby, the signal levels of the gate signals G1, G2, G3, . . . , and Gn are fixed to the voltage VGL in the display suspension period T2. Additionally, as shown by the voltage waveform W9com in the display suspension period T2, the display control circuit 140 sets, from time t291 to time t292 in the display suspension period T2, the voltage of the common electrode Tcom of the respective pixels to the voltage VGH (e.g., +15V).

According to the present embodiment, an electric field directed from the gate of the TFT 1213 (gate electrode 12 shown in FIG. 9B) towards the back gate (transparent conductive film 19 shown in FIG. 9B) is generated. By this electric field, electrons injected into the gate insulating film 13 in the display period T1 are emitted from the gate insulating film 13. For this reason, it becomes possible to much more quickly restore the threshold voltage Vth of the TFT 1213, as compared to the above-described eighth embodiment. In addition, according to the present embodiment, similar to the above-described seventh embodiment, it is possible to eliminate in the display suspension period T2, a period in which voltage stress which causes an increase in threshold voltage Vth of the TFT 1213 occurs. Therefore, as compared to the above-described first to fifth embodiments, it is possible to much more quickly recover the threshold voltage Vth of the TFT 1213, and to reduce the power consumption required for scanning Additionally, according to the present embodiment, there becomes no need to generate the common electrode voltage Vcom in the display suspension period T2, thereby making it possible to reduce the power consumption.

[Tenth Embodiment]

Next, a tenth embodiment of the present invention will be described with reference to FIGS. 19 to 21.

Also in the tenth embodiment, the configurations shown in FIGS. 1 to 4 used in the first embodiment are diverted.

It has been described in the above-described first to ninth embodiments that the TFT 1213 functioning as the output transistor is a general device having a single gate structure. Meanwhile, in the tenth embodiment, a TFT having a double gate structure is used as the TFT 1213. Hereinafter, the TFT 1213 having the double gate structure is referred to as a "TFT 1213*dg*." The TFT 1213*dg* includes a later-described back gate electrode (BG) 20. Except for the TFT 1213*dg* being included, and control related to a voltage applied to the back gate electrode (BG) 20 of the TFT 1213*dg*, the configurations and operation are similar to those of the above-described first embodiment. Here, the tenth embodiment can also be combined with the above-described first to ninth embodiments.

A configuration of the TFT 1213*dg* having the double gate structure (transistor having the double gate structure) and constituting the above-described TFT 1213 will be described with reference to FIG. 19.

Figure 19:
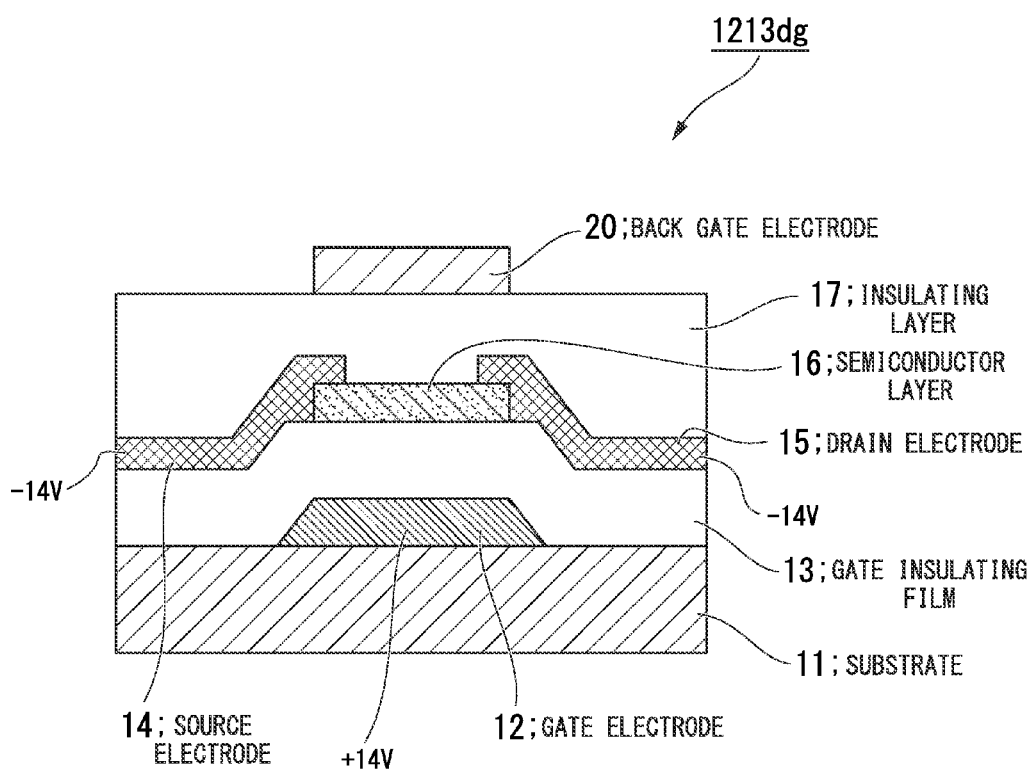
FIG. 19 is a cross-sectional view showing an example of a configuration (double gate structure) of transistors constituting a shift register circuit according to a tenth embodiment.

FIG. 19 is a cross-sectional view showing an example of the TFT 1213*dg* having the double gate structure according to the present embodiment. The same reference numerals are appended to elements common to the above-described constituent elements of the TFT 1213 shown in FIG. 9B, and a description thereof will be omitted.

As shown in FIG. 19, in the TFT 213*dg* having the double gate structure, the back gate electrode (BG) 20 is formed on the insulating film 17 at a position opposed to the gate electrode 12. The back gate electrode 20 is disposed facing the gate electrode 12 so that the semiconductor layer 16 is placed therebetween. The TFT 1213*dg* having such a double gate structure is formed using the process of photolithography. The back gate electrode (BG) 20 is formed in the same layer as the transparent conductive film (transparent electrode) formed in the above-described pixel unit PIX. Thus, the TFT 1213dg having the double gate structure according to the present embodiment can be formed without requiring additional process steps.

As can be understood from FIG. 19, the TFT 1213*dg* includes the gate electrode 12 (first gate electrode) that controls a conduction state between the drain electrode 15 and source electrode 14, and the back gate electrode 20 (second gate electrode) formed through the insulating layer 17 and disposed facing the gate electrode 12 so that the semiconductor layer 16 between the drain electrode 15 and the source electrode 14 is placed between the back gate electrode 20 and the gate electrode 12.

Next, operation of the present embodiment will be described with reference to FIG. 20.

Figure 20:
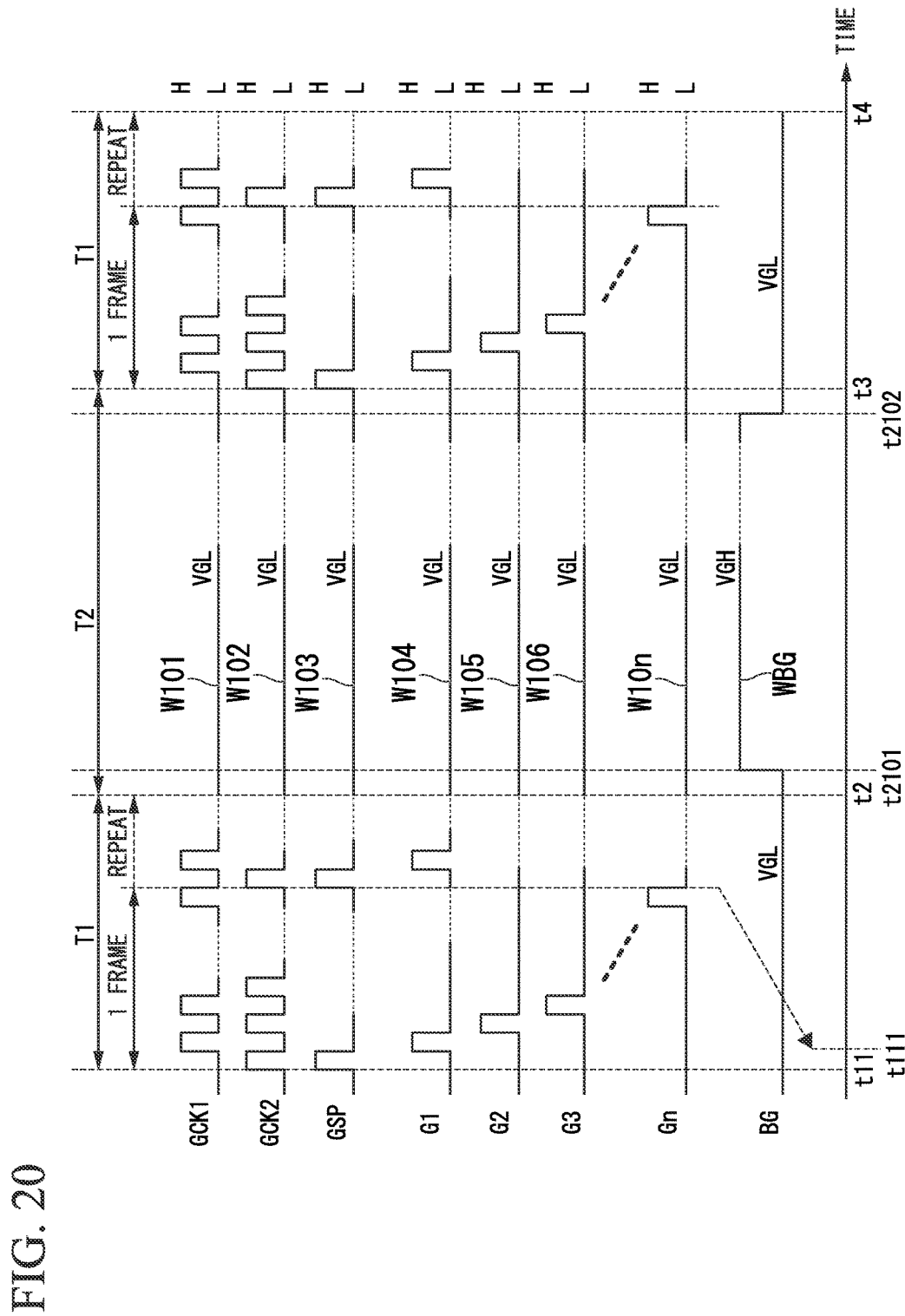
FIG. 20 is a time chart showing an example of operation of a shift register circuit according to a tenth embodiment.

FIG. 20 is a time chart showing an example of operation of the shift register circuit 121 according to the tenth embodiment. In the figure, waveforms W101, W102, and W103 respectively represent a voltage waveform of the clock signal GCK1, a voltage waveform of the clock signal GCK2, and a voltage waveform of the gate start pulse signal GSP. Additionally, waveforms W104, W105, W106, . . . , and W10n respectively represent voltage waveforms of the gate signals G1, G2, G3, . . . , and Gn. Further, a waveform WBG represents a voltage waveform to be applied to the back gate electrode (BG) 20.

As shown by the waveform WBG in the display suspension period T2 shown in FIG. 20, the display control circuit 140 fixes, from time t2101 to time t2102 in the display suspension period T2, a voltage of the back gate electrode (BG) 20 to a voltage VGH (e.g., +15V) that is a predetermined level. In addition, as indicated by the waveforms W101, W102, and W103, the display control circuit 140 causes the clock signals GCK1 and GCK2 and the gate start pulse signal GSP not to be generated, and fixes these signal levels to the voltage VGL (e.g., −15V). Thereby, the respective signal levels of the gate signal G1, G2, G3, . . . , and Gn are fixed to the voltage VGL in the display suspension period T2.

Thus, in the present embodiment, the voltage of the back gate electrode (BG) 20 is fixed to the voltage VGH in the display suspension period T2, thereby forming between the gate electrode 12 and the back gate electrode 20, an electric field directed from the back gate electrode 20 to the gate electrode 12. By this electric field, electrons injected into the gate insulating film 13 in the display period T1 are discharged from the gate insulating film 13 toward the back gate electrode 20 in the display suspension period T2, thereby decreasing the number of electrons injected into the gate insulating film 13. Consequently, the threshold voltage Vth of the TFT 1213*dg* decreases to be restored towards the initial threshold voltage Vth0.

Figure 21:
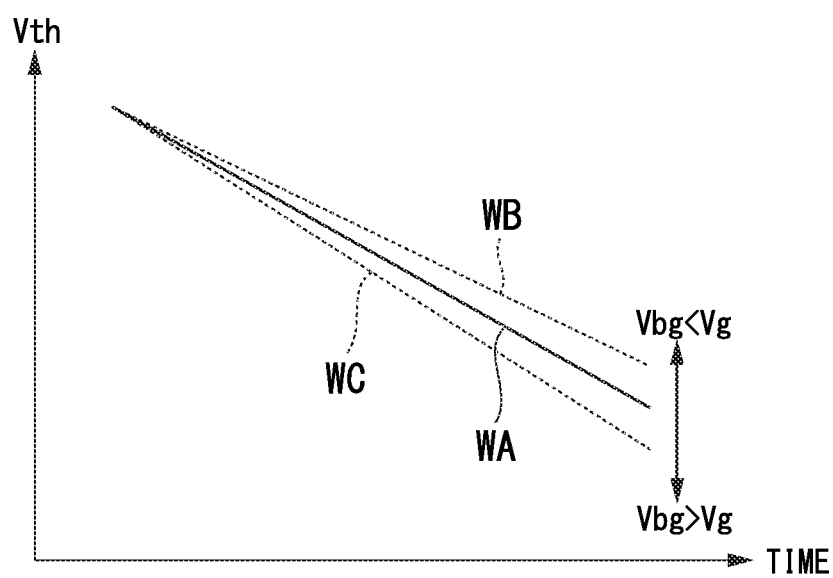
FIG. 21 is a diagram schematically showing an example of a change in threshold value of a transistor having the double gate structure according to the tenth embodiment.

FIG. 21 is a diagram schematically showing an example of a change in threshold voltage Vth of the TFT 1213*dg* having the double gate structure according to the tenth embodiment and showing a relationship between elapsed time of the non-operating state of the TFT 1213*dg* having the double gate structure and the threshold voltage Vth. In this figure, a vertical axis represents the threshold voltage (Vth) of the TFT 1213*dg*, and a horizontal axis represents the logarithm of the elapsed time of the non-operation state.

Additionally, in FIG. 21, a waveform WA represents a change in threshold voltage Vth in a case where no voltage is applied to the back gate electrode (BG) 20 in the non-operating state. The waveform WA in the case where no voltage is applied to the back gate electrode (BG) 20 corresponds to the waveform of the threshold voltage of a general TFT including no back gate electrode 18. Further, a waveform WB represents a change in threshold voltage Vth in a case where the voltage Vbg of the back gate electrode (BG) 20 is lower than the gate voltage Vg (Vbg<Vg) in the non-operating state. Moreover, a waveform WC represents a change in threshold voltage Vth in a case where the voltage Vbg of the back gate electrode (BG) 20 is higher than the gate voltage Vg (Vbg>Vg) in the non-operating state.

Generally, in a state where a voltage of 0V is applied to the gate electrode (Vg=0V) in the non-operating state, no voltage stress is applied to the TFT. If the state in which no voltage stress is applied to the TFT continues, the TFT using an oxide semiconductor such as In—Ga—Zn—O shows characteristics such that the threshold value voltage Vth is gradually restored over time. In other words, the TFT shows a tendency such that, the threshold voltage Vth changed in the positive direction in the operating state gradually shifts in the negative direction in the non-operating state, and attempts to return to the initial threshold voltage Vth0.

Regarding the TFT 1213*dg* having the double gate structure according to the present embodiment, as shown in FIG. 21, the restored amount of the threshold voltage Vth is changed in the non-operating state, depending on the voltage applied to the back gate electrode 20. For example, the restored amount of the threshold voltage Vth becomes smaller and a time required to return to the initial threshold voltage Vth0 becomes longer in the case where the voltage Vbg of the back gate electrode 20 is lower than the gate voltage Vg (waveform WB) than in the case where no voltage is applied to the back gate electrode 20 (waveform WA). Additionally, the restored amount of the threshold voltage Vth becomes larger and a time required to return to the initial threshold voltage Vth0 becomes shorter in the case where the voltage Vbg of the back gate electrode 20 is higher than the voltage Vg (waveform WC) than in the case where no voltage is applied to the back gate electrode 20 (waveform WA).

In the present embodiment, as the voltage Vbg of the back gate electrode (BG) 20 of the TFT 1213*dg* constituting the shift register circuit 121, the voltage VGH higher than the gate voltage Vg (VGL) is applied. For this reason, as indicated by the waveform WC shown in FIG. 21, restoration of the threshold voltage Vth of the TFT 1213*dg* is promoted. Therefore, it is possible to much more quickly restore the threshold voltage Vth of the TFT 1213*dg*, as compared to the above-described first to ninth embodiments.

Here, it has been described in the present embodiment that the back gate electrode 20 is fixed to the voltage VGH indicating the high level. However, the present embodiment is not limited to this example, and the back gate electrode 20 may be fixed to the voltage VGL indicating the low level.

[Eleventh Embodiment]

Next, an eleventh embodiment of the present invention will be described with reference to FIG. 22.

Also in the eleventh embodiment, the configurations shown in FIGS. 1 to 4 used in the first embodiment are diverted.

In the eleventh embodiment, the display device 100 according to any one of the first to tenth embodiments is applied to a portable terminal device, such as a smartphone. It has been described in the above-described first to tenth embodiments that the display suspension period T2 is any period other than the period for displaying an image. Meanwhile, in the present embodiment, the display suspension period T2 corresponds to a period for charging a battery included in a device, such as a portable terminal device, which is mounted with the display device according to any one of the above-described first to tenth embodiments. In other words, control of the bias state of the output transistor is performed during the period, in the display suspension period T2, for charging the battery included in the device, such as a portable terminal device, which is mounted with the display device according to any one of the above embodiments. In the present embodiment, the display control circuit 140 performs a series of operation of restoring the threshold voltage Vth in the display suspension period T2 according to any one of the above-described one to tenth embodiments, in a state where a backlight of the display unit of the portable terminal device is turned off or the brightness is decreased, and the portable terminal device is in the charged state.

Configurations and operation of the display device according to the present embodiment are basically similar to those of the first to tenth embodiments.

Figure 22:
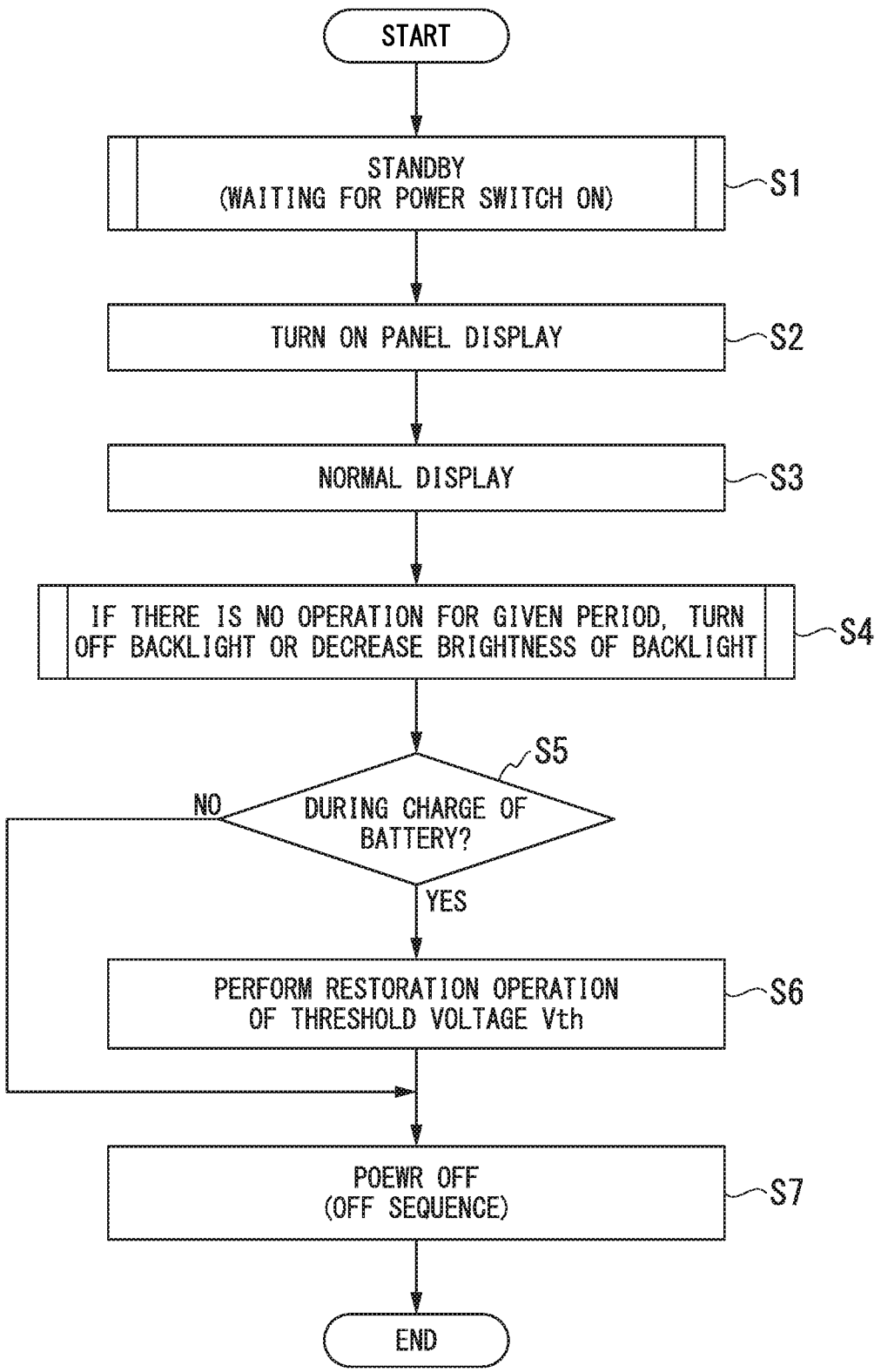
FIG. 22 is a flowchart illustrating an example of operation of a portable terminal device according to an eleventh embodiment.

FIG. 22 is a flowchart illustrating an example of operation of the portable terminal device according to the eleventh embodiment.

In step S1 shown in the figure, the portable terminal device applied with the display device according to any one of the above-described first to tenth embodiments is in the standby state, and waits for user operation for power switch on.

Subsequently, in step S2, when the user operates the portable terminal device, in response to this operation, a control unit (not shown) of the portable terminal device turns on a panel display of the display device according to any of the above-described first to tenth embodiments.

Subsequently, in step S3, in response to the user operation, the portable terminal device performs normal display operation in the above-described display period T1.

Subsequently, in step S4, if there is no user operation for a predetermined time, the control unit of the portable terminal device notifies the display control circuit 140 of the display device of that fact, controls the backlight of the display unit 110 of the display device to enter the off-state, thus turning off the backlight. Alternatively, if there is no user operation for a given period, the control unit of the portable terminal device notifies the display control circuit 140 of the display unit of that fact, and decreases the brightness of the backlight of the display unit 110 of the display device.

Subsequently, in step S5, the control unit of the portable terminal device determines whether or not a charge of the battery is being performed in the state where the backlight of the display unit 110 has been controlled to be in the off-state or in the state where the brightness thereof is decreased. Here, if the charge of the battery is being performed (step S5: YES), in step S6, the control unit of portable terminal device causes the display control circuit 140 of the display device to perform the above-described operation to restore the threshold voltage Vth in the display suspension period T2. Thereafter, if there is no user operation, in step S7, the control unit of the portable terminal device performs an off-sequence to turn off the power of the display device.

In contrast, if the charge of the battery is not being performed (step S5: NO), step S6 is skipped, the above-described operation to restore the threshold voltage Vth in the display suspension period T2 is not performed. Additionally, in step S7, the control unit of the portable terminal device performs an off-sequence to turn off the power of the display device.

Thus, in the present embodiment, the display device mounted on the portable terminal device performs the operation to restore the threshold voltage Vth according to the above-described first to tenth embodiments in the period in which the backlight is turned off or the brightness thereof is decreased, and the battery is being charged.

Generally, a standby mode of a portable terminal device is intended to suppress power consumption. Accordingly, if the above-described operation of restoring the threshold voltage Vth is performed in the normal standby mode without performing the charge of the battery, the power consumption increases, thereby impairing the purpose of the standby mode. For this reason, in the present embodiment, as described above, the operation of restoring the threshold voltage Vth is performed during the charge of the battery where an increase in power consumption is allowed.

According to the present embodiment, it is possible to, using the period for charging the battery of the portable terminal device, ensure a sufficient time to restore the threshold voltage Vth of the TFT 1213 included in the display device. Therefore, it becomes possible to sufficiently restore the threshold voltage Vth of the TFT 1213 shifted in the display period T1.

Here, it has been described in the eleventh embodiment that the display device according to the present invention has been applied to a portable terminal device. However, the display device according to the present invention is not limited to the portable terminal device, and is applicable to any feed.

Although the present invention has been expressed as a display device in the above-described first to eleventh embodiments, the present invention can also be expressed as a method of driving a display device. In this case, the present invention can be expressed as a method of driving the display device according to each of the above-described embodiments, the method including a step for the display control circuit 140 to control bias states of the TFTs 1213 and 1213*dg* in the display suspension period T2 so as to decrease absolute values of the threshold voltages Vth of the TFTs 1213 and 1213*dg*, as the output transistors shifted during the display period T1.

Although the embodiments of the present invention have been described, the above-described first to eleventh embodiments may be combined arbitrarily. Additionally, the present invention is not limited to the above-described embodiments, and various modifications, changes, and substitutions can be made without departing from the scope of the present invention.

INDUSTRIAL APPLICABILITY

The one aspect of the present invention is applicable to a display device and a driving method thereof, which are required to reduce a shift in threshold voltage of transistors constituting a driver circuit of the display device and to suppress deterioration of display performance.

DESCRIPTION OF REFERENCE NUMERALS

11: substrate
12: gate electrode
13: gate insulating film
14: source electrode
15: drain electrode
16: semiconductor layer
17: insulating layer
18: seal material
19: transparent conductive film
20: back gate electrode
100: display device
110: display unit
114: pixel TFT
115: pixel capacitor unit
120: scanning line driver circuit (driver unit)
121: shift register circuit
1211, 1212, 1213, 1213dg, 1214: TFT
1215: capacitor
$121_1$, $121_2$, $121_3$, . . . , $121_n$, 1210: shift register unit circuit
130: signal line driver circuit
131, 132: booster circuit
133: driver unit
1331, 1332: driver
140: display control circuit (control unit)
141: timing control circuit
G1, G2, . . . , and Gn: gate signal
GL1, GL2, . . . , and GLn: scanning line
PIX: pixel unit
S1 to S7: processing step
SL1, SL2, . . . , and SLm: signal line
Tcom: common terminal

The invention claimed is:

1. A display device comprising:
a display unit including a plurality of pixel units arranged in a matrix;
a driver unit including an output transistor configured to drive a plurality of scanning lines connected to the plurality of pixel units constituting the display unit; and
a control unit configured to
supply to the driver unit in a display period, a signal for displaying an image on the display unit, and
control a bias state of the output transistor in a display suspension period, so that an absolute value of a threshold voltage of the output transistor which is increased in the display period decreases,
wherein the control unit is confiuured to control a gate, a source, and a drain of the output transistor to be biased to a voltage equal to or lower than a back gate voltage of the output transistor.

2. The display device according to claim 1, wherein the control unit is configured to supply to the driver unit in the display suspension period, a signal with a frequency that is lower than a frequency of the signal to be supplied to the driver unit in the display period.

3. The display device according to claim 1, wherein the control unit is configured to supply to the driver unit in the display suspension period, a signal with a frame frequency that is lower than a frame frequency of the signal to be supplied to the driver unit in the display period.

4. The display device according to claim 1, wherein the control unit is configured to fix a signal to be supplied to the driver unit in the display suspension period, to a predetermined level to relieve voltage stress applied to the output transistor.

5. The display device according to claim 4, wherein the control unit is configured to fix the signal to, as the predetermined level, a signal level corresponding to a voltage amplitude having an absolute value smaller than an absolute value of an voltage amplitude corresponding to a signal level to be supplied to the deriver unit in the display period.

6. The display device according to claim 1, wherein the control unit is configured to fix to the predetermined level to relieve voltage stress applied to the output transistor, a common electrode of the plurality of pixel units which is configured to act as a back gate of the output transistor in the display suspension period.

7. The display device according to claim 1, wherein
the output transistor has a double gate structure and comprises:
a first gate electrode configured to control a conduction state between a drain electrode and a source electrode; and
a second gate electrode formed through an insulating film and disposed facing the first gate electrode so that a semiconductor layer between the drain electrode and the source electrode is placed between the first and second gate electrodes, and
the output transistor is configured to fix a back gate that is the second gate electrode, to a predetermined level in the display suspension period.

8. The display device according to claim 1, wherein the control unit is configured to control, in a period that is a part of the display suspension period, the bias state of the output transistor so that the absolute value of the threshold voltage of the output transistor decreases.

9. The display device according to claim 1, wherein the control unit is configured to turn off or decrease a backlight of the display unit in the display suspension period.

10. The display device according to claim 1, wherein a period for controlling the bias state of the output transistor is a period, included in the display suspension period, for charging a battery included in a device mounted with the display device.

11. The display device according to claim 1, wherein the output transistor includes an oxide semiconductor.

12. The display device according to claim 11, wherein the oxide semiconductor includes indium, gallium, zinc, and oxygen.

13. The display device according to claim 12, wherein the oxide semiconductor has crystallinity.

14. A method of driving a display device, the display device comprising: a display unit including a plurality of pixel units arranged in a matrix; a driver unit including an output transistor configured to drive a plurality of scanning lines connected to the plurality of pixel units constituting the display unit; and a control unit configured to supply to the driver unit in a display period, a signal for displaying an image on the display unit, the method comprising:

controlling, by the control unit, a bias state of the output transistor in a display suspension period, so that an absolute value of a threshold voltage of the output transistor which is increased in the display period decreases, wherein the control unit is configured to control a gate, a source, and a drain of the output transistor to be biased to a voltage equal to or lower than a back gate voltage of the output transistor.

15. A display device comprising:

a display unit including a plurality of pixel units arranged in a matrix;

a driver unit including an output transistor configured to drive a plurality of scanning lines connected to the plurality of pixel units constituting the display unit; and a control unit configured to supply to the driver unit in a display period, a signal for displaying an image on the display unit, and control a bias state of the output transistor in a display suspension period, so that an absolute value of a threshold voltage of the output transistor which is increased in the display period decreases, wherein the control unit is configured to control, in a period that is a part of the display suspension period, the bias state of the output transistor so that the absolute value of the threshold voltage of the output transistor decreases.

16. The display device according to claim 15, wherein the control unit is configured to supply to the driver unit in the display suspension period, a signal with a frequency that is lower than a frequency of the signal to be supplied to the driver unit in the display period.

17. The display device according to claim 15, wherein the control unit is configured to supply to the driver unit in the display suspension period, a signal with a frame frequency that is lower than a frame frequency of the signal to be supplied to the driver unit in the display period.

18. The display device according to claim 15, wherein the control unit is configured to fix a signal to be supplied to the driver unit in the display suspension period, to a predetermined level to relieve voltage stress applied to the output transistor.

19. The display device according to claim 18, wherein the control unit is configured to fix the signal to, as the predetermined level, a signal level corresponding to a voltage amplitude having an absolute value smaller than an absolute value of an voltage amplitude corresponding to a signal level to be supplied to the deriver unit in the display period.

20. The display device according to claim 15, wherein the control unit is configured to fix to the predetermined level to relieve voltage stress applied to the output transistor, a common electrode of the plurality of pixel units which is configured to act as a back gate of the output transistor in the display suspension period.

* * * * *